(12) United States Patent
Wei et al.

(10) Patent No.: US 10,177,275 B2
(45) Date of Patent: *__Jan. 8, 2019__

(54) EPITAXIAL STRUCTURE AND METHOD FOR MAKING THE SAME

(71) Applicants: Tsinghua University, Beijing (CN); HON HAI PRECISION INDUSTRY CO., LTD., New Taipei (TW)

(72) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

(*) Notice: Subject to any disclaimer, the term of this patent is extended or adjusted under 35 U.S.C. 154(b) by 16 days.

This patent is subject to a terminal disclaimer.

(21) Appl. No.: 15/263,338

(22) Filed: Sep. 12, 2016

(65) Prior Publication Data

US 2016/0380147 A1    Dec. 29, 2016

Related U.S. Application Data

(63) Continuation of application No. 13/276,278, filed on Oct. 18, 2011, now Pat. No. 9,515,221, which is a (Continued)

(30) Foreign Application Priority Data

| Jan. 12, 2011 | (CN) | 2011 1 0005809 |
|---|---|---|
| Jan. 24, 2011 | (CN) | 2011 1 0025710 |
| Jan. 24, 2011 | (CN) | 2011 1 0025768 |
| Jan. 24, 2011 | (CN) | 2011 1 0025832 |
| Mar. 29, 2011 | (CN) | 2011 1 0076867 |
| Mar. 29, 2011 | (CN) | 2011 1 0076876 |
| Mar. 29, 2011 | (CN) | 2011 1 0076886 |
| Mar. 29, 2011 | (CN) | 2011 1 0076887 |

(Continued)

(51) Int. Cl.
*H01L 33/12* (2010.01)
*H01L 51/00* (2006.01)
(Continued)

(52) U.S. Cl.
CPC .............. *H01L 33/12* (2013.01); *B82Y 30/00* (2013.01); *B82Y 40/00* (2013.01);
(Continued)

(58) Field of Classification Search
CPC ........................................................ H01L 21/20
See application file for complete search history.

(56) References Cited

U.S. PATENT DOCUMENTS

| 9,515,221 B2* | 12/2016 | Wei | B82Y 30/00 |
| 2010/0327228 A1* | 12/2010 | Bando | C30B 25/02 |
| | | | 252/301.4 R |

* cited by examiner

*Primary Examiner* — Matthew Reames
*Assistant Examiner* — Christopher Culbert
(74) *Attorney, Agent, or Firm* — ScienBiziP, P.C.

(57) ABSTRACT

An epitaxial structure and a method for making the same are provided. The epitaxial structure includes a substrate, an epitaxial layer and a carbon nanotube layer. The epitaxial layer is located on the substrate. The carbon nanotube layer is located in the epitaxial layer. The method includes following steps. A substrate having an epitaxial growth surface is provided. A carbon nanotube layer is suspended above the epitaxial growth surface. An epitaxial layer is epitaxially grown from the epitaxial growth surface to enclose the carbon nanotube layer therein.

15 Claims, 44 Drawing Sheets

Related U.S. Application Data continuation of application No. 13/273,252, filed on Oct. 14, 2011, now Pat. No. 9,024,310.

(30) Foreign Application Priority Data

| Mar. 29, 2011 | (CN) | .......................... 2011 1 0076893 |
| Mar. 29, 2011 | (CN) | .......................... 2011 1 0076901 |
| Mar. 29, 2011 | (CN) | .......................... 2011 1 0076903 |
| Mar. 29, 2011 | (CN) | .......................... 2011 1 0077488 |
| Apr. 15, 2011 | (CN) | .......................... 2011 1 0095149 |

(51) Int. Cl.

| *B82Y 30/00* | (2011.01) |
| *B82Y 40/00* | (2011.01) |
| *C30B 25/02* | (2006.01) |
| *C30B 25/18* | (2006.01) |
| *C30B 29/40* | (2006.01) |
| *H01L 29/06* | (2006.01) |
| *H01L 33/00* | (2010.01) |
| *H01L 21/02* | (2006.01) |
| *C01B 21/06* | (2006.01) |
| *H01L 21/67* | (2006.01) |
| *C01B 32/168* | (2017.01) |

(52) U.S. Cl.
CPC ........ *C01B 21/0632* (2013.01); *C01B 32/168* (2017.08); *C30B 25/02* (2013.01); *C30B 25/186* (2013.01); *C30B 29/403* (2013.01); *C30B 29/406* (2013.01); *H01L 21/0242* (2013.01); *H01L 21/0254* (2013.01); *H01L 21/0262* (2013.01); *H01L 21/02444* (2013.01); *H01L 21/02458* (2013.01); *H01L 21/02576* (2013.01); *H01L 21/02579* (2013.01); *H01L 21/02598* (2013.01); *H01L 21/02642* (2013.01); *H01L 21/02647* (2013.01); *H01L 21/67109* (2013.01); *H01L 29/0673* (2013.01); *H01L 33/007* (2013.01); *H01L 33/0075* (2013.01); *H01L 33/0079* (2013.01); *H01L 51/0048* (2013.01); *H01L 21/0245* (2013.01); *H01L 21/02422* (2013.01); *H01L 2924/0002* (2013.01); *Y10S 977/734* (2013.01); *Y10S 977/742* (2013.01); *Y10S 977/75* (2013.01); *Y10S 977/752* (2013.01); *Y10S 977/755* (2013.01); *Y10S 977/788* (2013.01); *Y10S 977/789* (2013.01); *Y10S 977/847* (2013.01); *Y10S 977/887* (2013.01); *Y10S 977/932* (2013.01); *Y10T 428/24331* (2015.01)

EPITAXIAL STRUCTURE AND METHOD FOR MAKING THE SAME

CROSS-REFERENCE TO RELATED APPLICATIONS

This application is a continuation application of U.S. patent application Ser. No. 13/276,278, filed Oct. 18, 2011, entitled, "EPITAXIAL STRUCTURE AND METHOD FOR MAKING THE SAME," which is a continuation application of U.S. patent application Ser. No. 13/273,252, filed Oct. 14, 2011, entitled, "EPITAXIAL STRUCTURE," which claims all benefits accruing under 35 U.S.C. § 119 from China Patent Applications: Application No. 201110005809.X, filed on Jan. 12, 2011; Application No. 201110025832.5, filed on Jan. 24, 2011; Application No. 201110025768.0, filed on Jan. 24, 2011; Application No. 201110025710.6, filed on Jan. 24, 2011; Application No. 201110077488.4, filed on Mar. 29, 2011; Application No. 201110076893.4, filed on Mar. 29, 2011; Application No. 201110076876.0, filed on Mar. 29, 2011; Application No. 201110076867.1, filed on Mar. 29, 2011; Application No. 201110076886.4, filed on Mar. 29, 2011; Application No. 201110076887.9, filed on Mar. 29, 2011; Application No. 201110076901.5, filed on Mar. 29, 2011; Application No. 201110076903.4, filed on Mar. 29, 2011; Application No. 201110095149.9, filed on Apr. 15, 2011; in the China Intellectual Property Office, disclosures of which are incorporated herein by references.

BACKGROUND

1. Technical Field

The present disclosure relates to epitaxial structures and methods for making the same.

2. Description of Related Art

Light emitting devices such as light emitting diodes (LEDs) based on group III-V nitride semiconductors such as gallium nitride (GaN) have been put into practice.

Since wide GaN substrate cannot be produced, the LEDs have been produced on a heteroepitaxial substrate such as sapphire. The use of sapphire substrate is problematic due to lattice mismatch and thermal expansion mismatch between GaN and the sapphire substrate. One consequence of thermal expansion mismatch is bowing of the GaN/sapphire substrate structure, which leads to cracking and difficulty in fabricating devices with small feature sizes. A solution for this is to form a plurality of grooves on the surface of the sapphire substrate by lithography or etching before growing the GaN layer. However, the process of lithography and etching is complex, high in cost, and will pollute the sapphire substrate.

What is needed, therefore, is to provide a method for solving the problem discussed above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Figure 1:
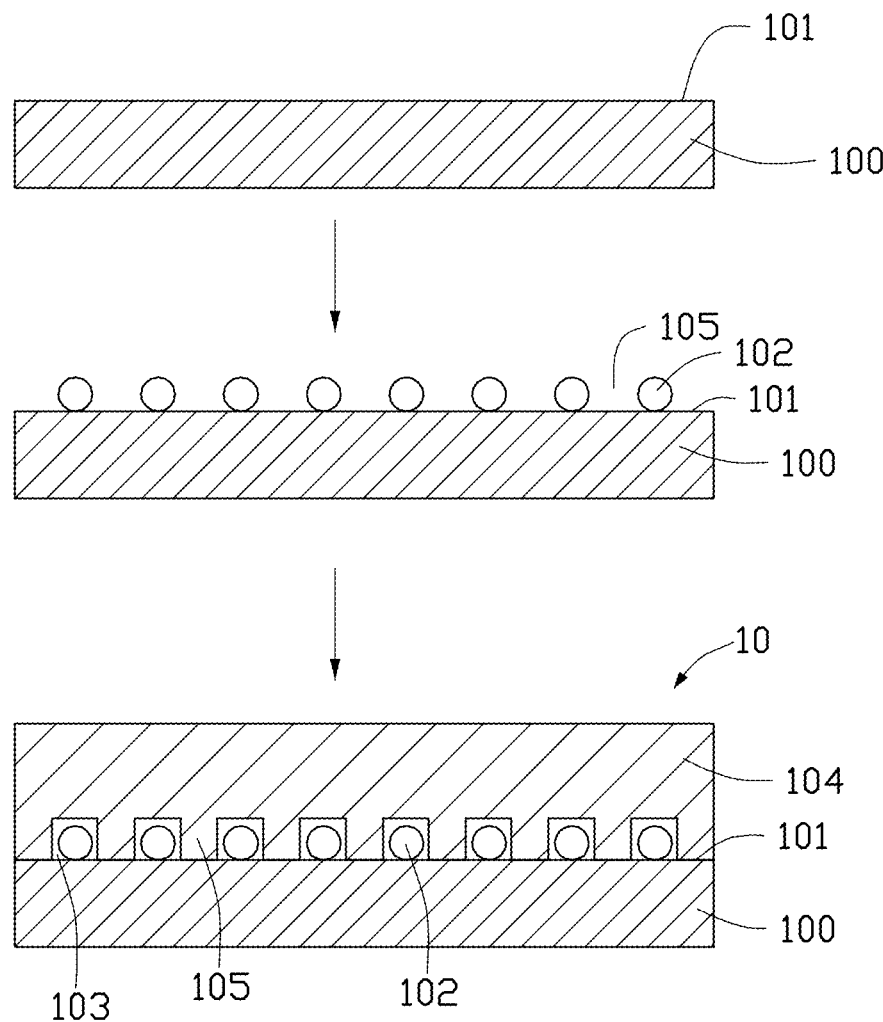
FIG. 1 is a flowchart of one embodiment of a method for making an epitaxial structure.

Referring to FIG. 1, a method for making an epitaxial structure 10 of one embodiment includes the following steps:

step (10), providing a substrate 100 having an epitaxial growth surface 101;

step (20), placing a first carbon nanotube layer 102 on the epitaxial growth surface 101; and step (30), epitaxially growing a first epitaxial layer 104 on the epitaxial growth surface 101.

In step (10), the epitaxial growth surface 101 can be used to grow the first epitaxial layer 104. The epitaxial growth surface 101 is a clean and smooth surface. The substrate 100 can be a single-layer structure or a multi-layer structure. If the substrate 100 is a single-layer structure, the substrate 100 can be a single crystal structure having a crystal face used as the epitaxial growth surface 101. If the substrate 100 is a multi-layer structure, the substrate 100 should include at least one layer having the crystal face. The material of the substrate 100 can be GaAs, GaN, AlN, Si, SOI (silicon on insulator), SiC, MgO, ZnO, LiGaO$_2$, LiAlO$_2$, or Al$_2$O$_3$. The material of the substrate 100 can be selected according to the material of the first epitaxial layer 104. The first epitaxial layer 104 and the substrate 100 should have a small lattice mismatch and a thermal expansion mismatch. The size, thickness, and shape of the substrate 100 can be selected according to need. In one embodiment, the substrate 100 is a sapphire substrate.

Figure 2:
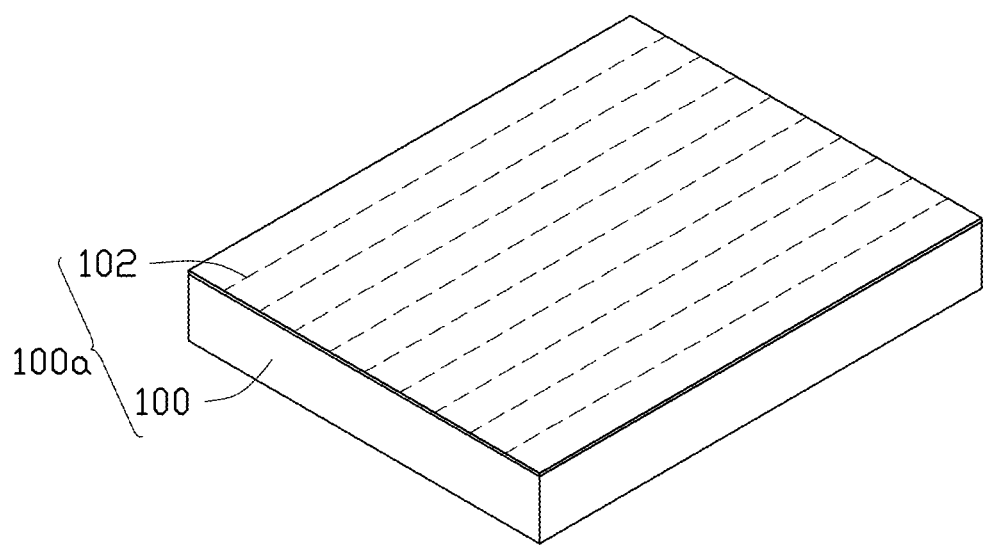
FIG. 2 is a base for growing an epitaxial structure of one embodiment, wherein the base includes a plurality of carbon nanotubes located on a substrate and extending along the same direction.
Figure 3:
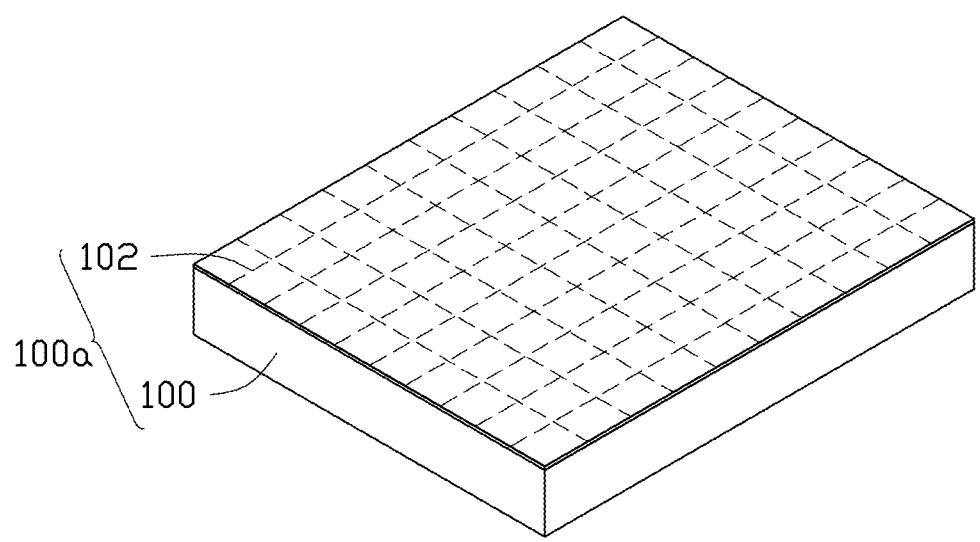
FIG. 3 is a base for growing an epitaxial structure of one embodiment, wherein the base includes a plurality of carbon nanotubes located on a substrate and extending along two directions perpendicular with each other.

In step (20), a base 100a for growing the first epitaxial layer 104 is obtained as shown in FIGS. 2 and 3. The base 100a includes a substrate 100 having an epitaxial growth surface 101 and a first carbon nanotube layer 102 located thereon. The base 100a can be used to grow the first epitaxial layer 104 directly.

The first carbon nanotube layer 102 includes a plurality of carbon nanotubes. The carbon nanotubes in the first carbon nanotube layer 102 can be single-walled, double-walled, or multi-walled carbon nanotubes. The length and diameter of the carbon nanotubes can be selected according to need. The thickness of the first carbon nanotube layer 102 can be in a range from about 1 nanometer to about 100 micrometers. For example, the thickness of the first carbon nanotube layer 102 can be about 10 nanometers, 100 nanometers, 200 nanometers, 1 micrometer, 10 micrometers, or 50 micrometers. The first carbon nanotube layer 102 forms a pattern, therefore, part of the epitaxial growth surface 101 can be exposed from the patterned first carbon nanotube layer 102 after the first carbon nanotube layer 102 is placed on the epitaxial growth surface 101. Thus, the first epitaxial layer 104 can grow from the exposed epitaxial growth surface 101.

The patterned first carbon nanotube layer 102 defines a plurality of first apertures 105. The first apertures 105 can be dispersed uniformly. The first aperture 105 extends throughout the first carbon nanotube layer 102 along the thickness direction thereof. The first aperture 105 can be a hole defined by several adjacent carbon nanotubes, or a gap defined by two substantially parallel carbon nanotubes and extending along axial direction of the carbon nanotubes. The hole shaped first aperture 105 and the gap shaped first aperture 105 can exist in the patterned first carbon nanotube layer 102 at the same time. Hereafter, the size of the first aperture 105 is the diameter of the hole or width of the gap. The sizes of the first apertures 105 can be different. The average size of the first apertures 105 can be in a range from about 10 nanometers to about 500 micrometers. For example, the sizes of the first apertures 105 can be about 50 nanometers, 100 nanometers, 500 nanometers, 1 micrometer, 10 micrometers, 80 micrometers, or 120 micrometers. The smaller the sizes of the first apertures 105, the less dislocation defects will occur during the process of growing the first epitaxial layer 104. In one embodiment, the sizes of the first apertures 105 are in a range from about 10 nanometers to about 10 micrometers. A dutyfactor of the first carbon nanotube layer 102 is an area ratio between the sheltered epitaxial growth surface 101 and the exposed epitaxial growth surface 101. The dutyfactor of the first carbon nanotube layer 102 can be in a range from about 1:100 to about 100:1. For example, the dutyfactor of the first carbon nanotube layer 102 can be about 1:10, 1:2, 1:4, 4:1, 2:1, or 10:1. In one embodiment, the dutyfactor of the first carbon nanotube layer 102 is in a range from about 1:4 to about 4:1.

The carbon nanotubes of the first carbon nanotube layer 102 can be orderly arranged to form an ordered carbon nanotube structure or disorderly arranged to form a disordered carbon nanotube structure. The term 'disordered carbon nanotube structure' includes, but is not limited to, a structure wherein the carbon nanotubes are arranged along many different directions, and the aligning directions of the carbon nanotubes are random. The number of the carbon nanotubes arranged along each different direction can be almost the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure wherein the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the first carbon nanotube layer 102 are arranged to extend along the direction substantially parallel to the surface of the first carbon nanotube layer 102 so that it is easy to obtain a pattern having greater light transmission. After placement on the epitaxial growth surface 101, the carbon nanotubes in the first carbon nanotube layer 102 can be arranged to extend along the direction substantially parallel to the epitaxial growth surface 101. Referring to FIG. 2, a majority of the carbon nanotubes in the first carbon nanotube layer 102 are arranged to extend along the same direction. Referring to FIG. 3, some of the carbon nanotubes in the first carbon nanotube layer 102 are arranged to extend along a first direction, and the rest of the carbon nanotubes in the first carbon nanotube layer 102 are arranged to extend along a second direction, substantially perpendicular to the first direction. The carbon nanotubes in the ordered carbon nanotube structure can also be arranged to extend along the crystallographic orientation of the substrate 100 or along a direction which forms an angle with the crystallographic orientation of the substrate 100.

The first carbon nanotube layer 102 can be formed on the epitaxial growth surface 101 by chemical vapor deposition (CVD), transfer printing a preformed carbon nanotube film, or filtering and depositing a carbon nanotube suspension. In one embodiment, the first carbon nanotube layer 102 is a free-standing structure and can be drawn from a carbon nanotube array. The term "free-standing structure" means that the first carbon nanotube layer 102 can sustain the weight of itself when it is hoisted by a portion thereof without any significant damage to its structural integrity. Thus, the first carbon nanotube layer 102 can be suspended by two spaced supports. The free-standing first carbon nanotube layer 102 can be laid on the epitaxial growth surface 101 directly and easily.

The first carbon nanotube layer 102 can be a substantially pure structure of carbon nanotubes, with few impurities and chemical functional groups. The first carbon nanotube layer 102 can also be a composite including a carbon nanotube matrix and non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can be coated on the carbon nanotubes of the first carbon nanotube layer 102 or filled in the first aperture 105. In one embodiment, the non-carbon nanotube materials are coated on the carbon nanotubes of the first carbon nanotube layer 102 so that the carbon nanotubes can have greater diameters and the first apertures 105 can be smaller. The non-carbon nanotube materials can be deposited on the carbon nanotubes of the first carbon nanotube layer 102 by CVD or physical vapor deposition (PVD), such as sputtering.

Furthermore, the first carbon nanotube layer 102 can be treated with an organic solvent after being placed on the epitaxial growth surface 101 so that the first carbon nanotube layer 102 can be attached on the epitaxial growth surface 101 firmly. Specifically, the organic solvent can be applied to entire surface of the first carbon nanotube layer 102 or the entire first carbon nanotube layer 102 can be immersed in an organic solvent. The organic solvent can be volatile, such as ethanol, methanol, acetone, dichloroethane, chloroform, or mixtures thereof. In one embodiment, the organic solvent is ethanol.

The first carbon nanotube layer 102 can include at least one carbon nanotube film, at least one carbon nanotube wire, or combination thereof. In one embodiment, the first carbon nanotube layer 102 can include a single carbon nanotube film or two or more carbon nanotube films stacked together. Thus, the thickness of the first carbon nanotube layer 102 can be controlled by the number of the stacked carbon nanotube films. The number of the stacked carbon nanotube films can be in a range from about 2 to about 100. For example, the number of the stacked carbon nanotube films can be 10, 30, or 50. In one embodiment, the first carbon nanotube layer 102 can include a layer of parallel and spaced carbon nanotube wires. Also, the first carbon nanotube layer 102 can include a plurality of carbon nanotube wires crossed or weaved together to form a carbon nanotube net. The distance between two adjacent parallel and spaced carbon nanotube wires can be in a range from about 0.1 micrometers to about 200 micrometers. In one embodiment, the distance between two adjacent parallel and spaced carbon nanotube wires is in a range from about 10 micrometers to about 100 micrometers. The gap between two adjacent substantially parallel carbon nanotube wires is defined as the first aperture 105. The size of the first aperture 105 can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 4:
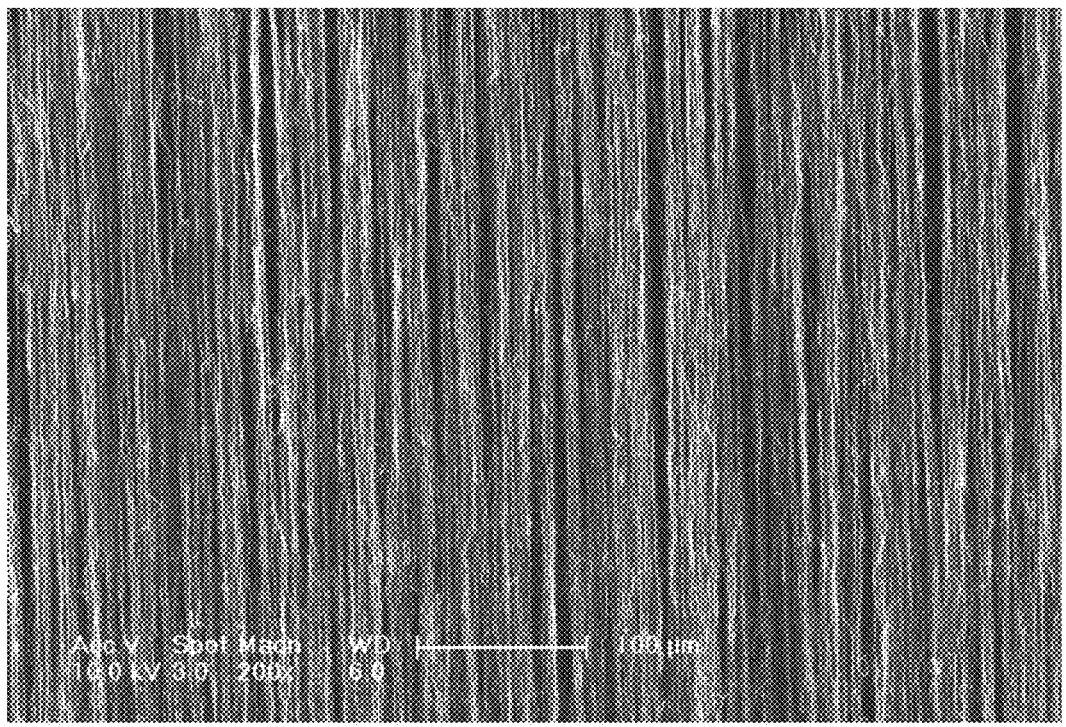
FIG. 4 is a Scanning Electron Microscope (SEM) image of a drawn carbon nanotube film.
Figure 5:
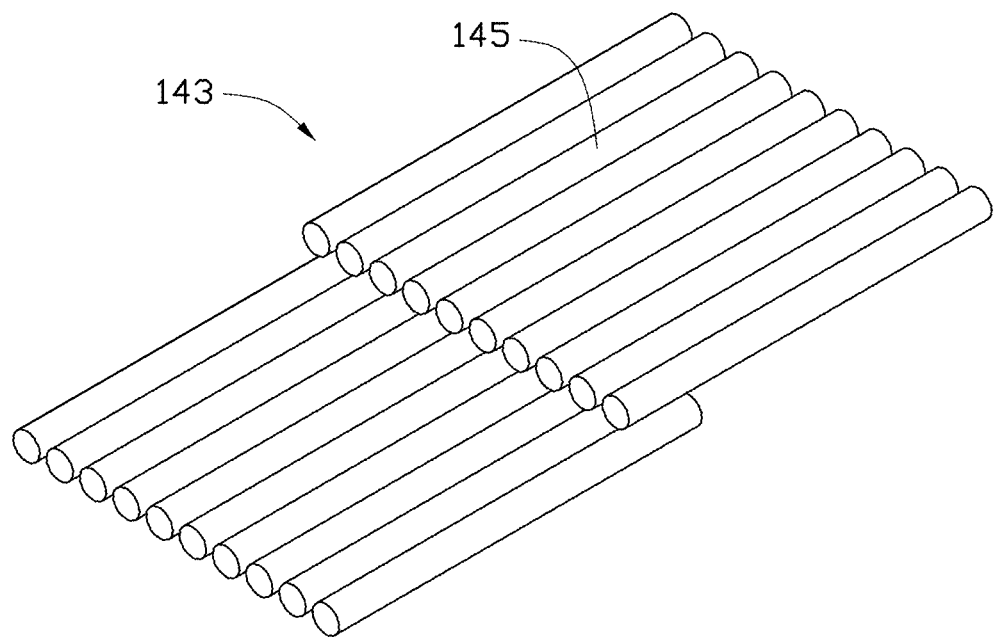
FIG. 5 is a schematic structural view of a carbon nanotube segment of the drawn carbon nanotube film of FIG. 4.

In one embodiment, the first carbon nanotube layer 102 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 4 to 5, each drawn carbon nanotube film includes a plurality of successively oriented carbon nanotube segments 143 joined end-to-end by van der Waals attractive force therebetween. Each carbon nanotube segment 143 includes a plurality of carbon nanotubes 145 parallel to each other, and combined by van der Waals attractive force therebetween. As can be seen in FIG. 4, some variations can occur in the drawn carbon nanotube film. The carbon nanotubes 145 in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film can be attached to the epitaxial growth surface 101 directly.

Figure 6:
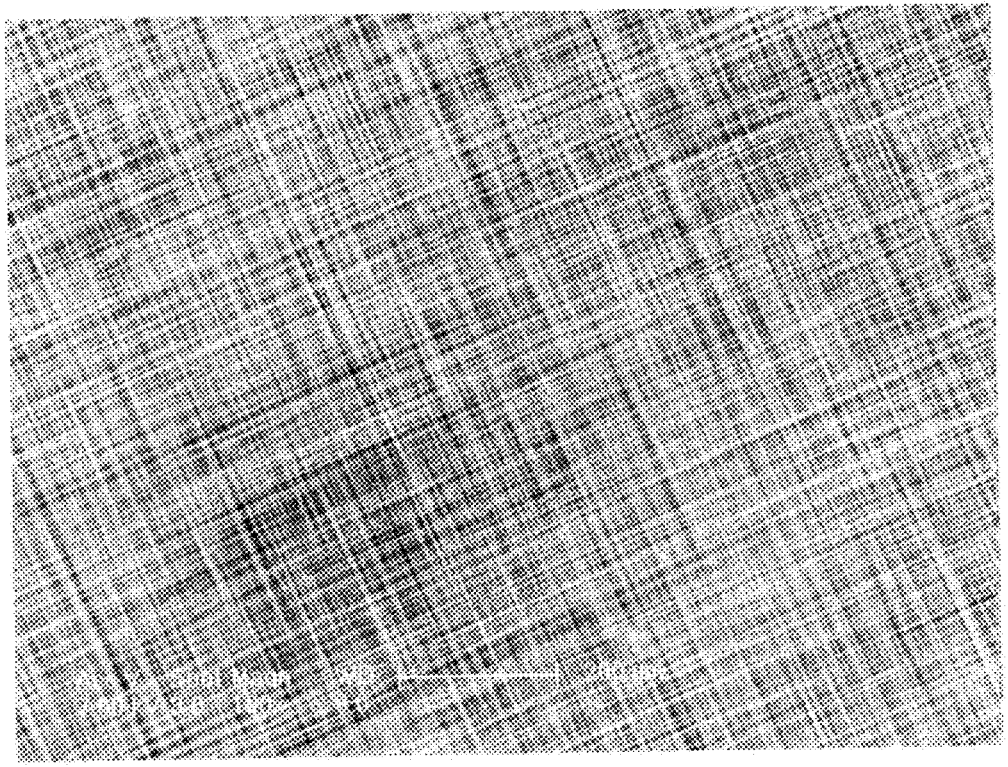
FIG. 6 is an SEM image of cross-stacked drawn carbon nanotube films.

The first carbon nanotube layer 102 can include at least two stacked drawn carbon nanotube films. In other embodiments, the first carbon nanotube layer 102 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the first carbon nanotube layer 102. Referring to FIG. 6, the first carbon nanotube layer 102 is shown with the aligned directions of the carbon nanotubes between adjacent stacked drawn carbon nanotube films at 90 degrees. Stacking the carbon nanotube films will also add to the structural integrity of the first carbon nanotube layer 102.

A step of heating the drawn carbon nanotube film can be performed to decrease the thickness of the drawn carbon nanotube film. The drawn carbon nanotube film can be partially heated by a laser or microwave. The thickness of the drawn carbon nanotube film can be reduced because some of the carbon nanotubes will be oxidized. In one embodiment, the drawn carbon nanotube film is irradiated by a laser device in an atmosphere comprising of oxygen therein. The power density of the laser is greater than $0.1 \times 10^4$ watts per square meter. The drawn carbon nanotube film can be heated by fixing the drawn carbon nanotube film and moving the laser device at a substantially uniform speed to irradiate the drawn carbon nanotube film. When the laser irradiates the drawn carbon nanotube film, the laser is focused on the surface of the drawn carbon nanotube film to form a laser spot. The diameter of the laser spot ranges from about 1 micron to about 5 millimeters. In one embodiment, the laser device is carbon dioxide laser device. The power of the laser device is about 30 watts. The wavelength of the laser is about 10.6 micrometers. The diameter of the laser spot is about 3 millimeters. The velocity of the laser movement is less than 10 millimeters per second. The power density of the laser is $0.053 \times 10^{12}$ watts per square meter.

Figure 7:
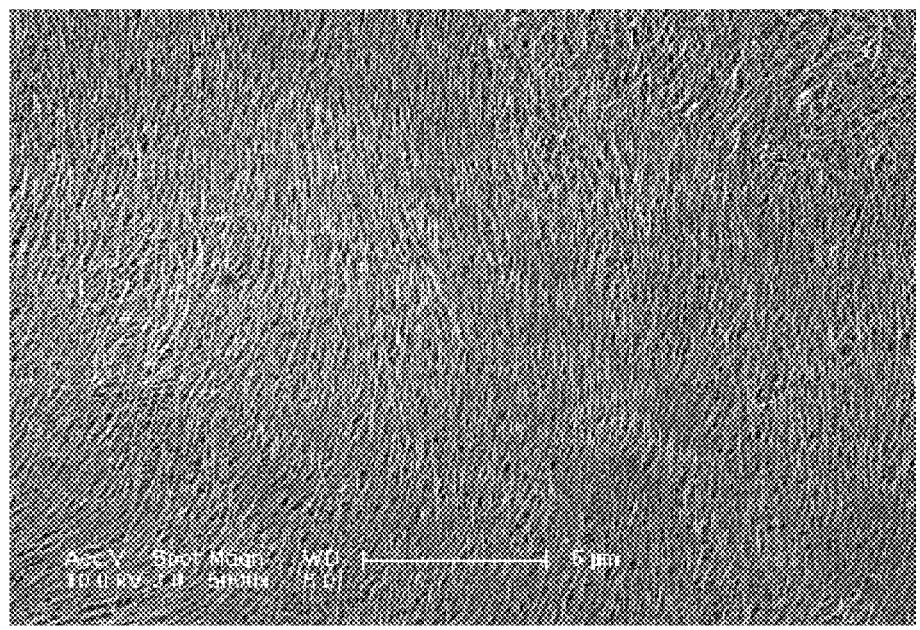
FIG. 7 is an SEM image of a pressed carbon nanotube film.

In another embodiment, the first carbon nanotube layer 102 can include a pressed carbon nanotube film. Referring to FIG. 7, the pressed carbon nanotube film can be a free-standing carbon nanotube film. The carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degrees to approximately 15 degrees. The greater the pressure applied, the smaller the angle formed. If the carbon nanotubes in the pressed carbon nanotube film are arranged along different directions, the first carbon nanotube layer 102 can be isotropic.

Figure 8:
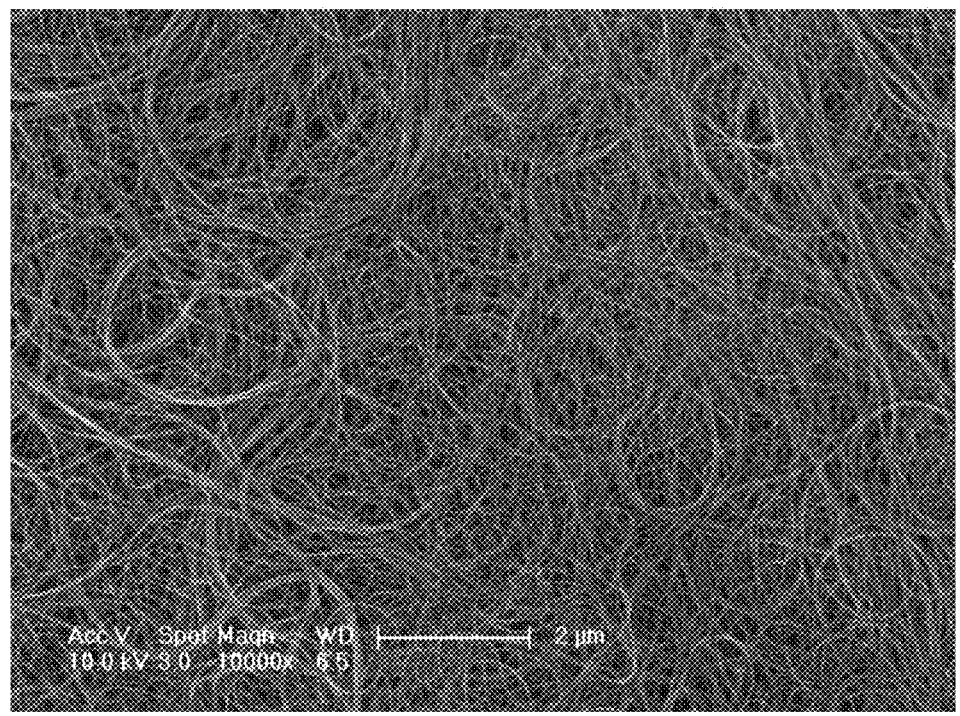
FIG. 8 is an SEM image of a flocculated carbon nanotube film.

In another embodiment, the first carbon nanotube layer 102 includes a flocculated carbon nanotube film. Referring to FIG. 8, the flocculated carbon nanotube film can include a plurality of long, curved, disordered carbon nanotubes entangled with each other. Furthermore, the flocculated carbon nanotube film can be isotropic. The carbon nanotubes can be substantially uniformly dispersed in the carbon nanotube film. Adjacent carbon nanotubes are acted upon by van der Waals attractive force to form an entangled structure with micropores defined therein. Sizes of the micropores can be less than 10 micrometers. The porous nature of the flocculated carbon nanotube film will increase the specific surface area of the first carbon nanotube layer 102. Further, due to the carbon nanotubes in the first carbon nanotube layer 102 being entangled with each other, the first carbon nanotube layer 102 employing the flocculated carbon nanotube film has excellent durability, and can be fashioned into desired shapes with a low risk to the integrity of the first carbon nanotube layer 102. The flocculated carbon nanotube film, in some embodiments, is free-standing due to the carbon nanotubes being entangled and adhered together by van der Waals attractive force therebetween.

Figure 9:
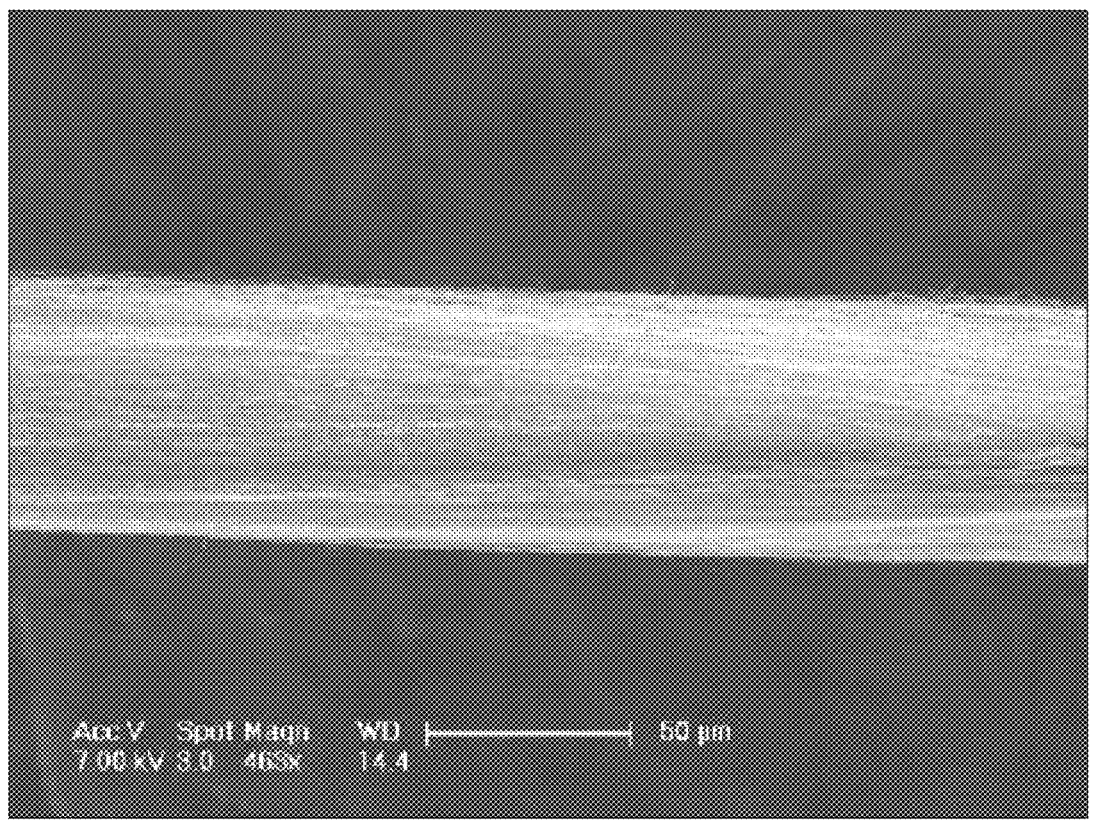
FIG. 9 is an SEM image of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. Referring to FIG. 9, the untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

Figure 10:
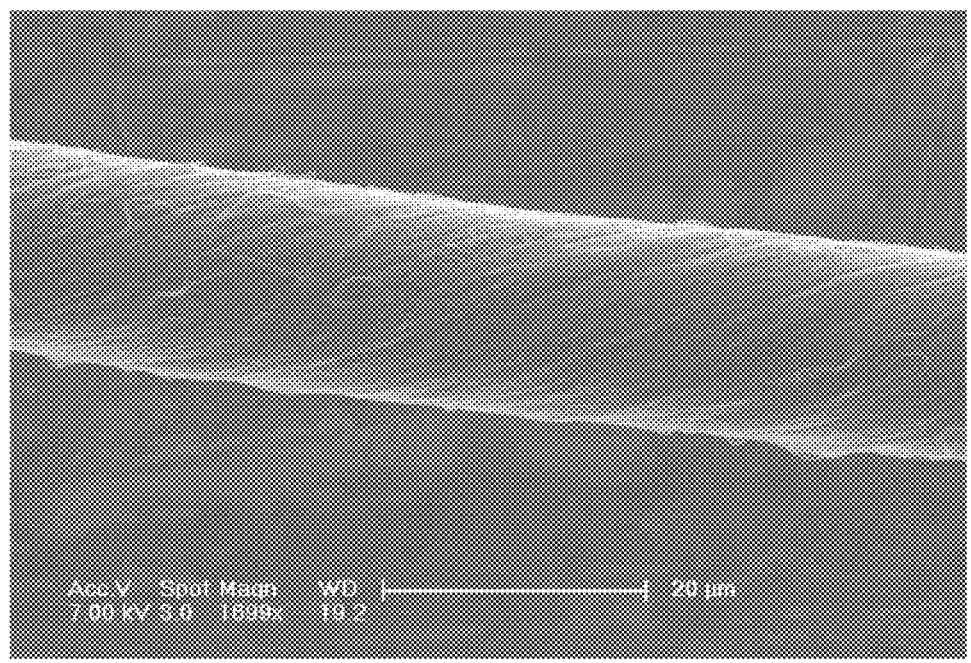
FIG. 10 is an SEM image of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 10, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire will decrease, while the density and strength of the twisted carbon nanotube wire will increase.

The first carbon nanotube layer 102 can be used as a mask for growing the first epitaxial layer 104. The mask is the first carbon nanotube layer 102 sheltering a part of the epitaxial growth surface 101 and exposing another part of the epitaxial growth surface 101. Thus, the first epitaxial layer 104 can grow from the exposed epitaxial growth surface 101. The first carbon nanotube layer 102 can form a patterned mask on the epitaxial growth surface 101 because the first carbon nanotube layer 102 defines a plurality of first apertures 105. Compared to lithography or etching, the method of forming a first carbon nanotube layer 102 as mask is simple, low in cost, and will not pollute the substrate 100.

In step (30), the first epitaxial layer 104 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD).

The first epitaxial layer 104 is a single crystal layer grown on the epitaxial growth surface 101 by epitaxy growth method. The material of the first epitaxial layer 104 can be the same as or different from the material of the substrate 100. If the first epitaxial layer 104 and the substrate 100 are the same material, the first epitaxial layer 104 is called a homogeneous epitaxial layer. If the first epitaxial layer 104 and the substrate 100 have different material, the first epitaxial layer 104 is called a heteroepitaxial epitaxial layer. The material of the first epitaxial layer 104 can be semiconductor, metal or alloy. The semiconductor can be Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. The metal can be aluminum, platinum, copper, or silver. The alloy can be MnGa, CoMnGa, or $Co_2MnGa$. The thickness of the first epitaxial layer 104 can be prepared according to need. The thickness of the first epitaxial layer 104 can be in a range from about 100 nanometers to about 500 micrometers. For example, the thickness of the first epitaxial layer 104 can be about 200 nanometers, 500 nanometers, 1 micrometer, 2 micrometers, 5 micrometers, 10 micrometers, or 50 micrometers.

Figure 11:
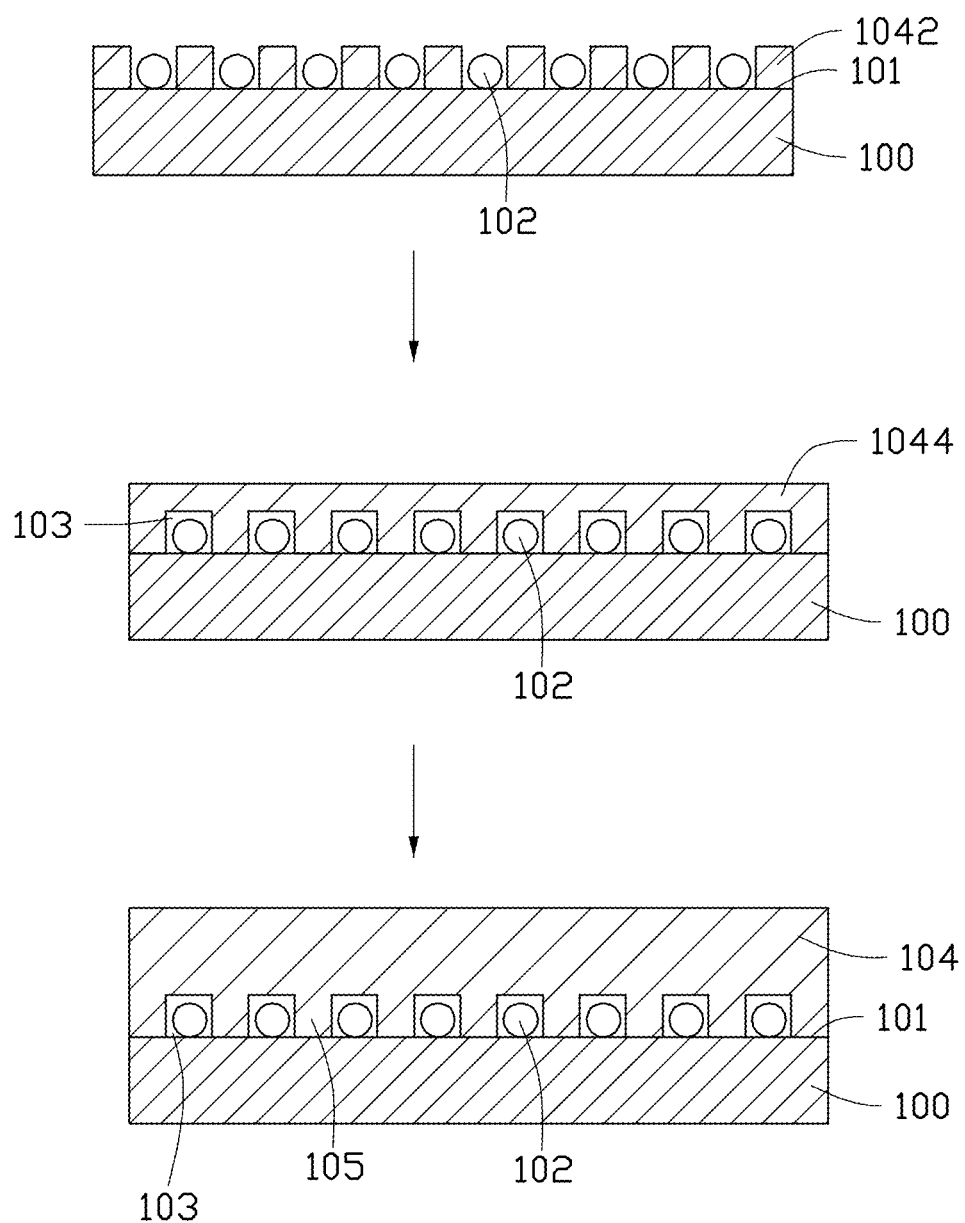
FIG. 11 is a process of growing a first epitaxial layer on a substrate.

Referring to FIG. 11, step (30) includes the following substeps:

step (301), nucleating on the epitaxial growth surface 101 and growing a plurality of epitaxial crystal grains 1042 along the direction substantially perpendicular to the epitaxial growth surface 101;

step (302), forming a continuous epitaxial film 1044 by making the epitaxial crystal grains 1042 grow along the direction substantially parallel to the epitaxial growth surface 101; and step (303), forming the first epitaxial layer 104 by making the epitaxial film 1044 grow along the direction substantially perpendicular to the epitaxial growth surface 101.

In step (301), the epitaxial crystal grains 1042 grow from the exposed part of the epitaxial growth surface 101 and through the first apertures 105. The process of the epitaxial crystal grains 1042 growing along the direction substantially perpendicular to the epitaxial growth surface 101 is called vertical epitaxial growth.

In step (302), the epitaxial crystal grains 1042 are joined together to form an integral structure (the epitaxial film 1044) to cover the first carbon nanotube layer 102. The epitaxial crystal grains 1042 grow and form a plurality of first caves 103 to enclose the carbon nanotubes of the first carbon nanotube layer 102. The inner wall of the first caves 103 can be in contact with the carbon nanotubes or spaced from the carbon nanotubes, depending on whether the material of the epitaxial film 1044 and the carbon nanotubes have mutual infiltration. Thus, the epitaxial film 1044 defines a patterned depression on the surface adjacent to the epitaxial growth surface 101. The patterned depression is related to the patterned first carbon nanotube layer 102. If the first carbon nanotube layer 102 includes a layer of parallel and spaced carbon nanotube wires, the patterned depression is a plurality of parallel and spaced grooves. If the first carbon nanotube layer 102 includes a plurality of carbon nanotube wires crossed or weaved together to form a carbon nanotube net, the patterned depression is a groove network including a plurality of intersected grooves. The first carbon nanotube layer 102 can prevent lattice dislocation between the epitaxial crystal grains 1042 and the substrate 100 from growing. The process of epitaxial crystal grains 1042 growing along the direction substantially parallel to the epitaxial growth surface 101 is called lateral epitaxial growth.

In step (303), the first epitaxial layer 104 is obtained by growing for a long duration of time. Because the first carbon nanotube layer 102 can prevent the lattice dislocation between the epitaxial crystal grains 1042 and the substrate 100 from growing in step (302), the first epitaxial layer 104 has fewer defects therein.

Figure 12:
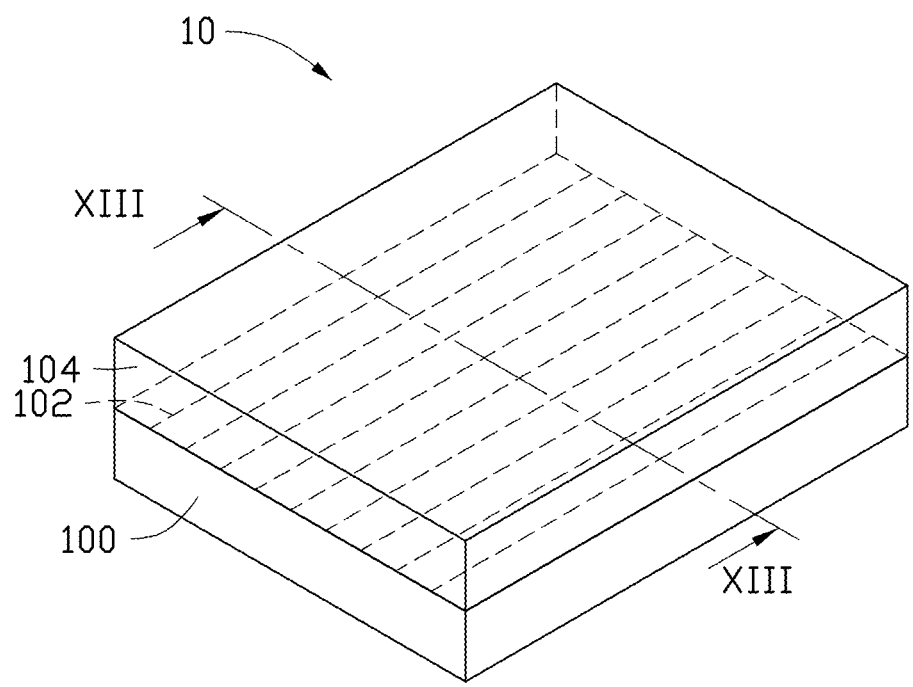
FIG. 12 is a schematic view of one embodiment of an epitaxial structure fabricated in the method of FIG. 1.
Figure 13:
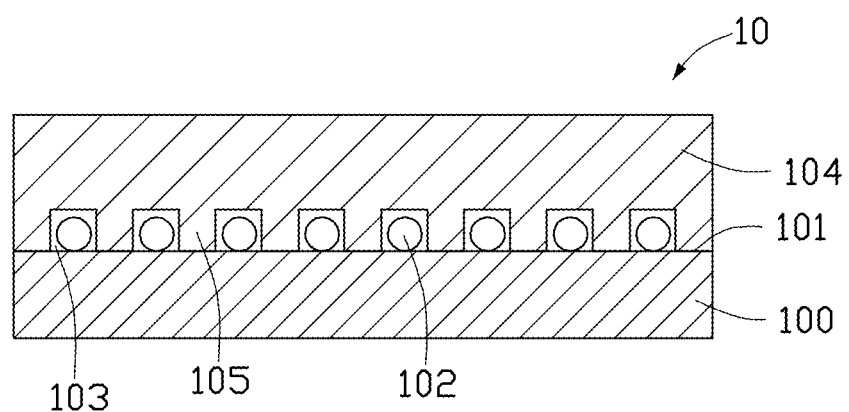
FIG. 13 is a schematic, cross-sectional view, along a line XIII-XIII of FIG. 12.
Figure 14:
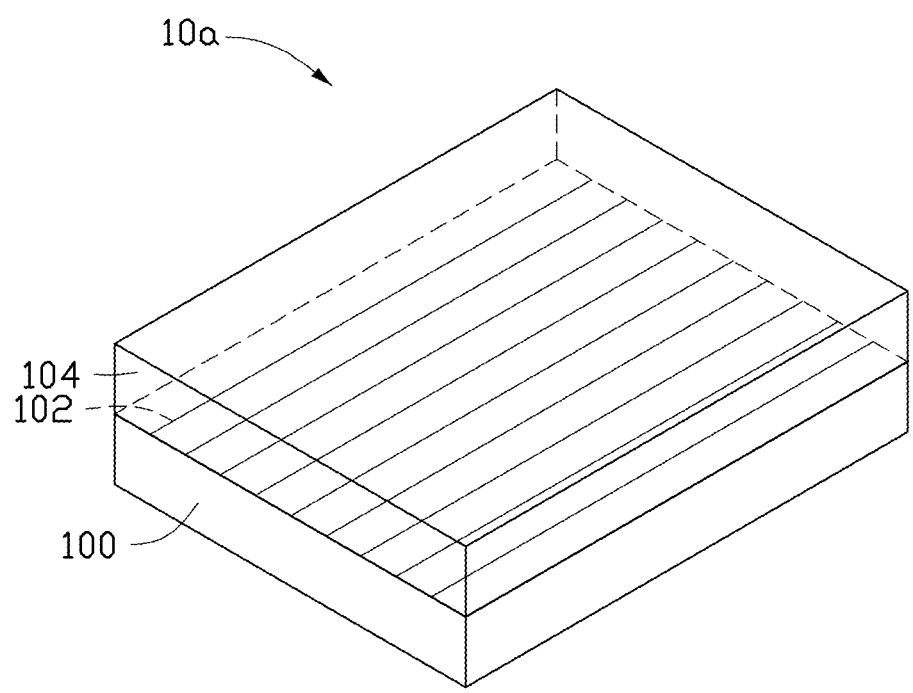
FIG. 14 is a schematic view of another embodiment of an epitaxial structure fabricated in the method of FIG. 1.
Figure 15:
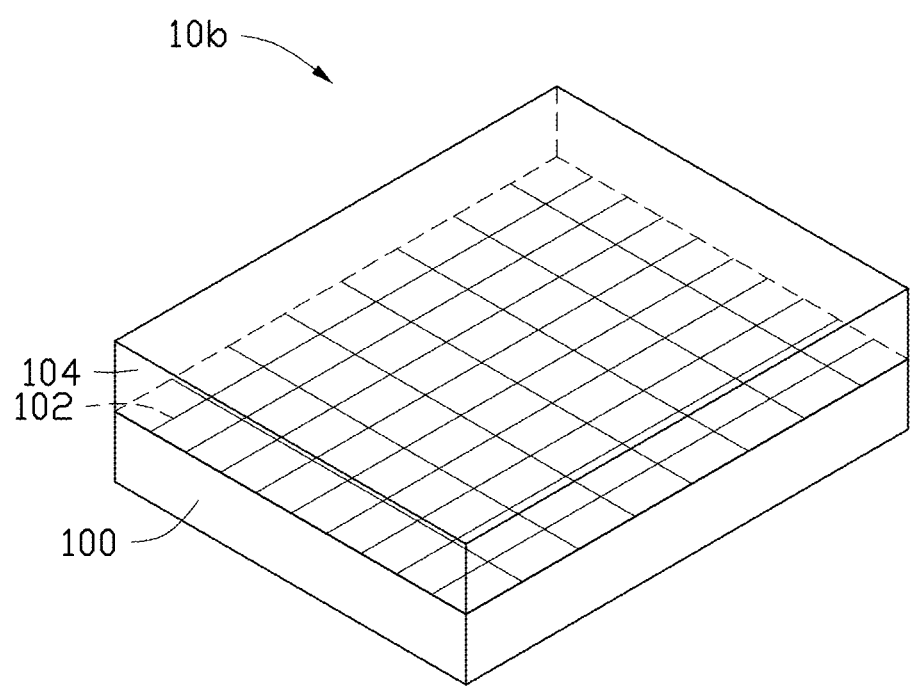
FIG. 15 is a schematic view of another embodiment of an epitaxial structure fabricated in the method of FIG. 1.

Referring to FIGS. 12 and 13, an epitaxial structure 10 provided in one embodiment includes a substrate 100, a first carbon nanotube layer 102, and a first epitaxial layer 104. The substrate 100 has an epitaxial growth surface 101. The first carbon nanotube layer 102 is located on the epitaxial growth surface 101 and defines a plurality of first apertures 105. The first epitaxial layer 104 is located on the first carbon nanotube layer 102 and contacts the epitaxial growth surface 101 through the first apertures 105. The first epitaxial layer 104 defines a plurality of first caves 103 adjacent to and oriented to the epitaxial growth surface 101. The first caves 103 can be blind holes or grooves. The first caves 103 and the epitaxial growth surface 101 cooperatively form a sealed chamber to receive the first carbon nanotube layer 102 therein. The inner wall of the first caves 103 can be spaced from the carbon nanotubes of the first carbon nanotube layer 102. In one embodiment, the first carbon nanotube layer 102 includes a drawn carbon nanotube film as shown in FIG. 12. In another embodiment, the first carbon nanotube layer 102 of an epitaxial structure 10a includes a layer of parallel and spaced carbon nanotube wires as shown in FIG. 14. In another embodiment, the first carbon nanotube layer 102 of an epitaxial structure 10b includes a plurality of carbon nanotube wires crossed or weaved together to form a carbon nanotube net as shown in FIG. 15.

Figure 16:
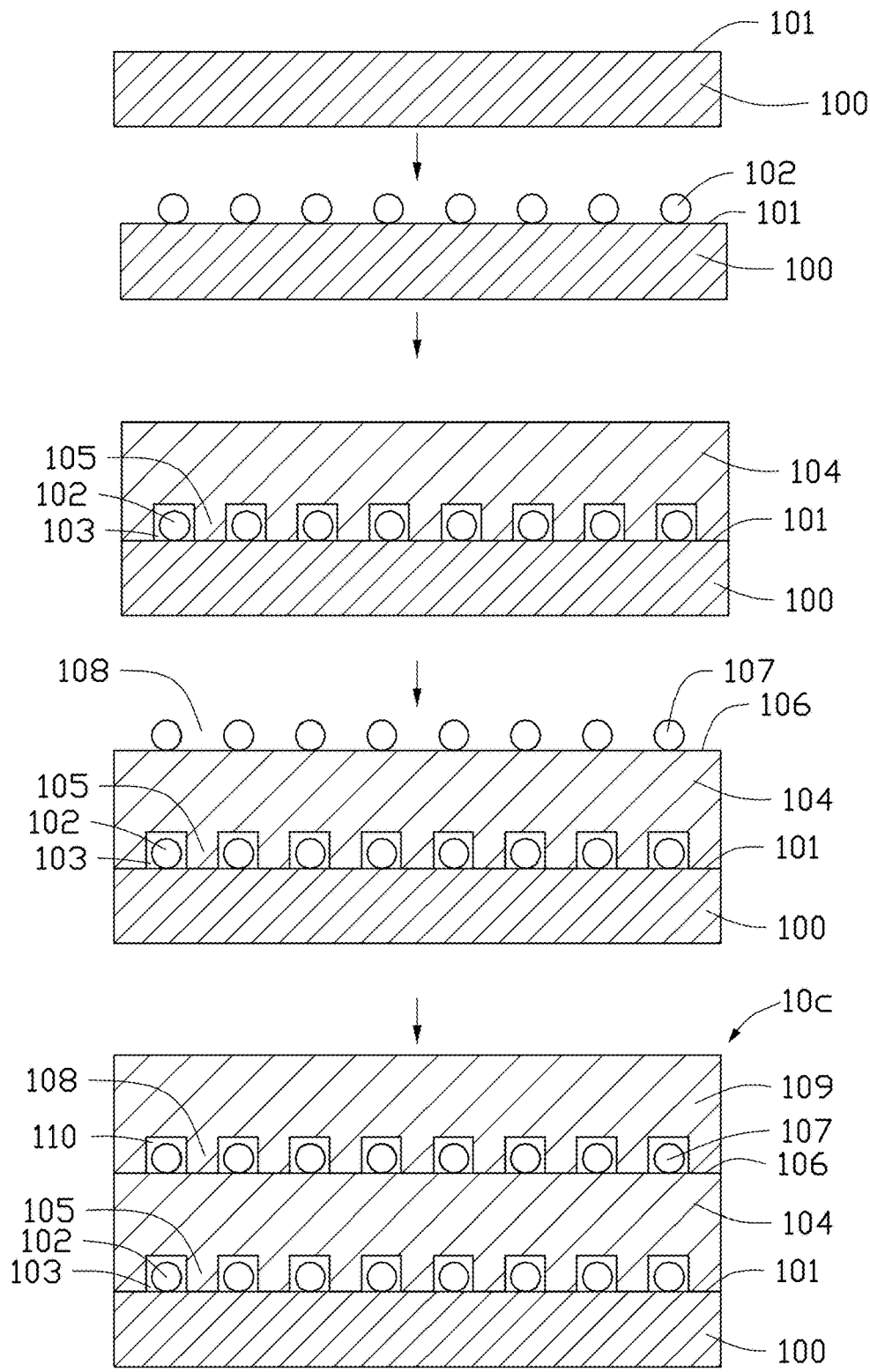
FIG. 16 is a flowchart of another embodiment of a method for making an epitaxial structure.

Referring to FIG. 16, a method for making an epitaxial structure 10c of one embodiment includes the following steps:

step (10), providing a substrate 100 having an epitaxial growth surface 101;

step (20), placing a first carbon nanotube layer 102 on the epitaxial growth surface 101;

step (30), epitaxially growing a first epitaxial layer 104 on the epitaxial growth surface 101;

step (40), placing a second carbon nanotube layer 107 on a surface 106 of the first epitaxial layer 104; and step (50), epitaxially growing a second epitaxial layer 109 on the first epitaxial layer 104.

The method for making an epitaxial structure 10c is similar to the method for making the epitaxial structure 10 described above except additional steps (40) and (50).

In step (40), the second carbon nanotube layer 107 is the same as the first carbon nanotube layer 102. The second carbon nanotube layer 107 defines a plurality of second apertures 108. In one embodiment, the second carbon nanotube layer 107 is a layer of parallel and spaced carbon nanotube wires. The second carbon nanotube layer 107 can be placed on the surface 106 of the first epitaxial layer 104 directly. The surface 106 can be used to grow the epitaxial layer.

In step (50), the method for epitaxially growing the second epitaxial layer 109 is the same as the method for epitaxially growing the first epitaxial layer 104. The material of the second epitaxial layer 109 and the material of the first epitaxial layer 104 can be the same. The second epitaxial layer 109 has improved quality because the first epitaxial layer 104 has less defects therein.

Figure 17:
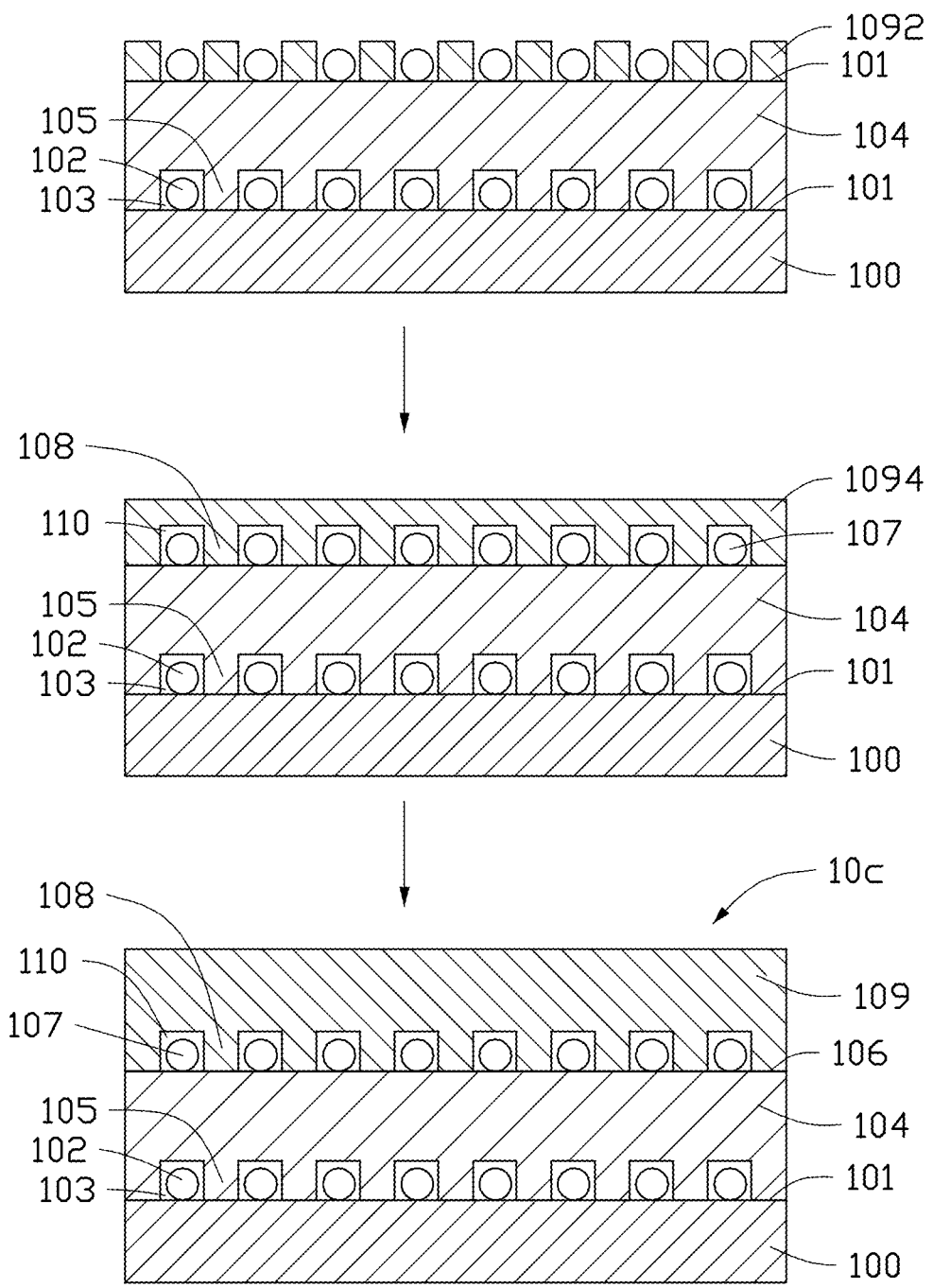
FIG. 17 is a process of growing a second epitaxial layer on the first epitaxial layer of FIG. 1.

Referring to FIG. 17, step (50) is similar to step (30) and includes following sub steps:

step (501), nucleating on the surface 106 and growing a plurality of epitaxial crystal grains 1092 along the direction substantially perpendicular to the surface 106;

step (502), forming a continuous epitaxial film 1094 by making the epitaxial crystal grains 1092 grow along the direction substantially parallel to the surface 106; and step (503), forming the first epitaxial layer 109 by making the epitaxial film 1094 grow along the direction substantially perpendicular to the surface 106.

Figure 18:
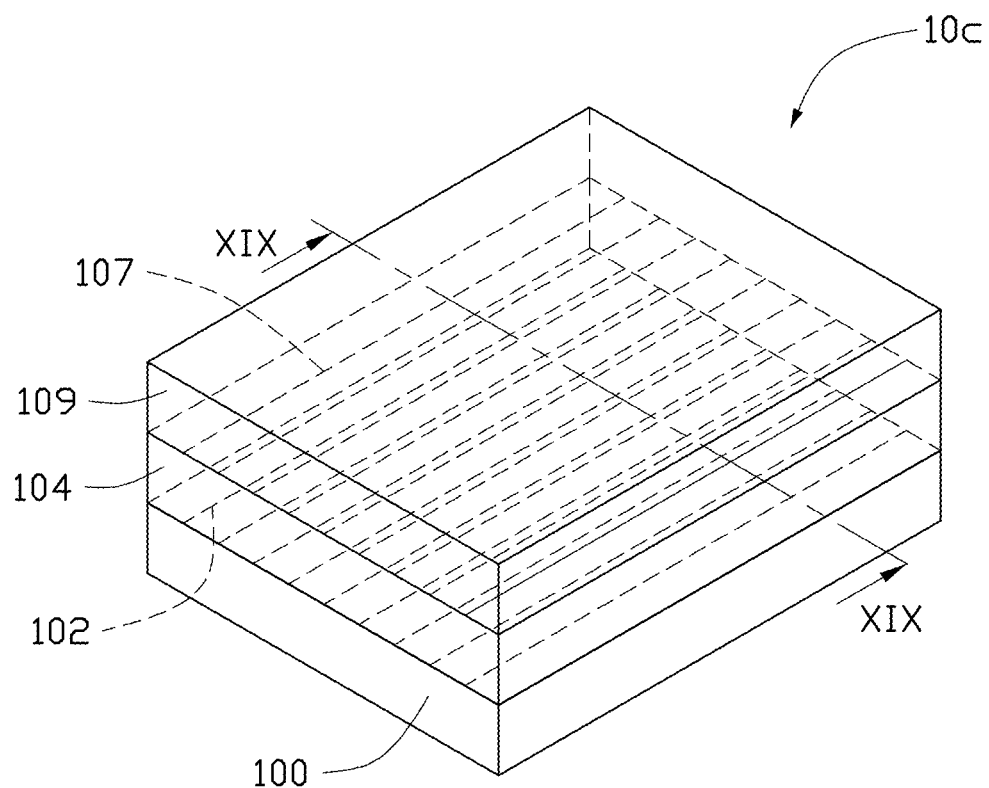
FIG. 18 is a schematic view of one embodiment of an epitaxial structure fabricated in the method of FIG. 16.
Figure 19:
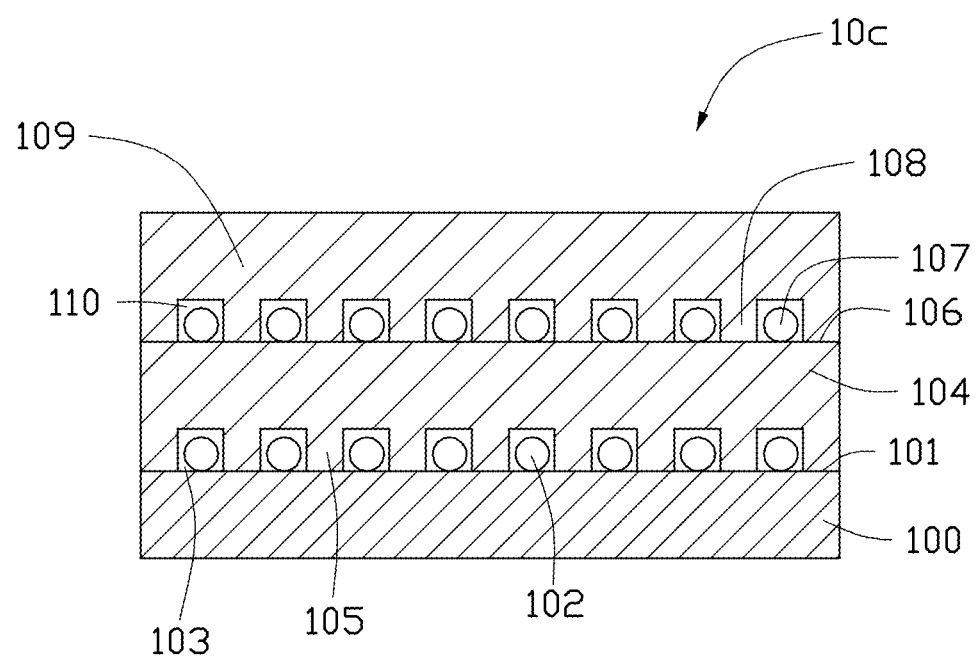
FIG. 19 is a schematic, cross-sectional view, along a line XIX-XIX of FIG. 18.

Referring to FIGS. 18 and 19, an epitaxial structure 10c provided in one embodiment includes a substrate 100, a first carbon nanotube layer 102, and a first epitaxial layer 104, a second carbon nanotube layer 107, and a second epitaxial layer 109. The substrate 100 has an epitaxial growth surface 101. The first carbon nanotube layer 102 is located on the epitaxial growth surface 101 and defines a plurality of first apertures 105. The first epitaxial layer 104 is located on the first carbon nanotube layer 102 and contacts the epitaxial growth surface 101 through the first apertures 105. The first epitaxial layer 104 defines a plurality of first caves 103. The carbon nanotubes of the first carbon nanotube layer 102 are enclosed in the first caves 103 and can be spaced from the inner wall of the first caves 103.

The second carbon nanotube layer 107 is located on the surface 106 of the first epitaxial layer 104 and defines a plurality of second apertures 108. The second epitaxial layer 109 is located on the second carbon nanotube layer 107 and contacts the surface 106 through the second apertures 108. The second epitaxial layer 109 defines a plurality of second caves 110 on a surface adjacent to the first epitaxial layer 104. The carbon nanotubes of the second carbon nanotube layer 107 are enclosed in the second caves 110 and covered by the first epitaxial layer 104. The carbon nanotubes of the second carbon nanotube layer 107 can be in contact with or spaced from the inner wall of the second caves 110.

Figure 20:
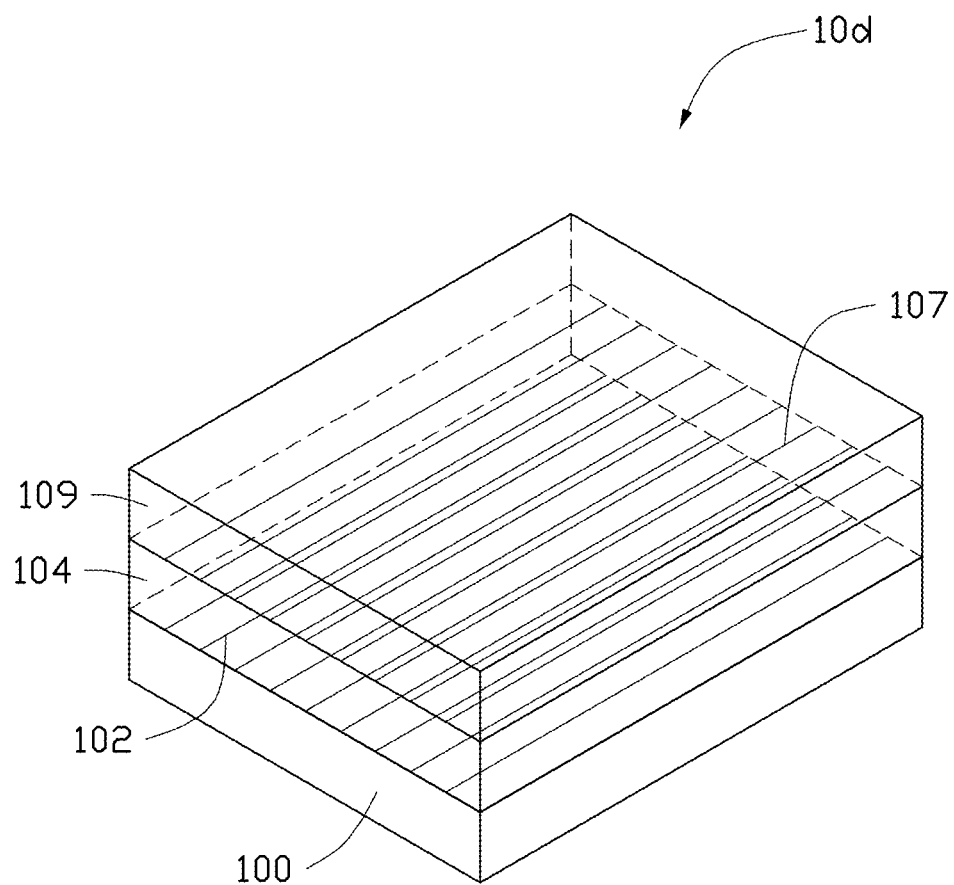
FIG. 20 is a schematic view of another embodiment of an epitaxial structure fabricated in the method of FIG. 16.
Figure 21:
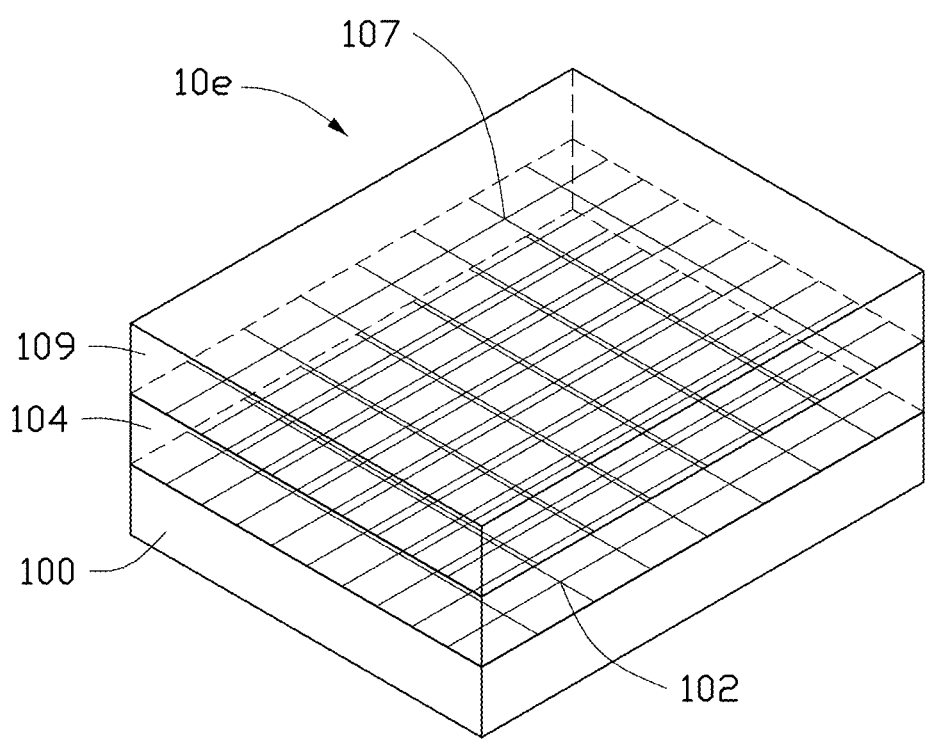
FIG. 21 is a schematic view of another embodiment of an epitaxial structure fabricated in the method of FIG. 16.

In one embodiment, both the first carbon nanotube layer 102 and the second carbon nanotube layer 107 include a drawn carbon nanotube film as shown in FIG. 18. In another embodiment, both the first carbon nanotube layer 102 and the second carbon nanotube layer 107 of an epitaxial structure 10d include a layer of parallel and spaced carbon nanotube wires as shown in FIG. 20. In another embodiment, both the first carbon nanotube layer 102 and the second carbon nanotube layer 107 of an epitaxial structure 10e include a plurality of carbon nanotube wires crossed, or weaved together to form a carbon nanotube net as shown in FIG. 21.

Figure 22:
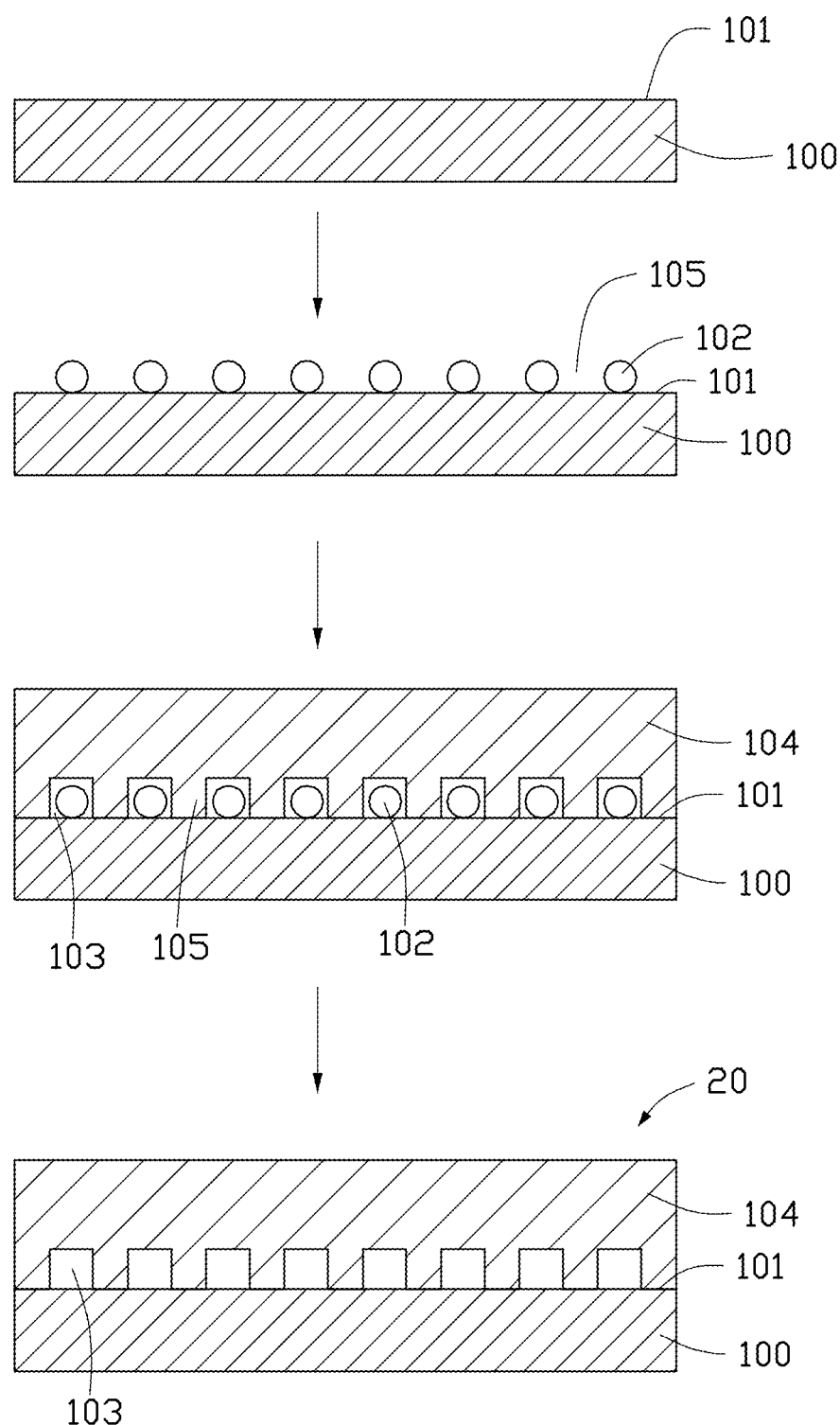
FIG. 22 is a flowchart of another embodiment of a method for making an epitaxial structure.

Referring to FIG. 22, a method for making an epitaxial structure 20 of one embodiment includes the following steps:

step (10), providing a substrate 100 having an epitaxial growth surface 101;

step (20), placing a first carbon nanotube layer 102 on the epitaxial growth surface 101;

step (30), forming an epitaxial structure preform by epitaxially growing a first epitaxial layer 104 on the epitaxial growth surface 101; and step (60), removing the first carbon nanotube layer 102.

The method for making an epitaxial structure 20 is similar to the method for making the epitaxial structure 10 described above except additional step (60). The step (60) can be performed by plasma etching, laser heating, or furnace heating.

In one embodiment, the first carbon nanotube layer 102 is removed by plasma etching and the step (60) includes the following substeps:

step (601), placing the epitaxial structure preform in a reacting room and creating a vacuum in the reacting room; and step (602), introducing a reacting gas in the reacting room and producing a plasma of the reacting gas by glow discharge.

In step (602), the reacting gas can be oxygen gas, hydrogen gas, carbon tetrafluoride gas, or tetrafluoromethane gas. In one embodiment, the reacting gas is oxygen gas and oxygen plasma is produced. The plasma can infiltrate into the first caves 103 to etch the first carbon nanotube layer 102. The plasma can react with the first carbon nanotube layer 102 from about 15 seconds to about 1 hour. The power of the glow discharge can be in a range from about 20 watts to about 300 watts. The flow of the reacting gas can be in a range from about 10 sccm to about 100 sccm. The gas pressure of the reacting room is about 1 pascal to about 100 pascals. In one embodiment, the reaction time is in a range from about 15 seconds to about 15 minutes, the power of the glow discharge is about 150 watts, and the gas pressure of the reacting room is about 10 Pa.

In one embodiment, the first carbon nanotube layer 102 is removed by laser heating and the step (60) includes the following substeps:

step (611), placing the epitaxial structure preform in an oxygen environment; and step (612), providing a laser beam to irradiate the substrate 100 or the first epitaxial layer 104.

In step (612), the laser beam can be provided by a laser device such as a solid laser device, a liquid laser device, a gas laser device, or a semiconductor laser device. In one embodiment, the laser device is a carbon dioxide laser device. The power of the laser device is about 30 watts. The wavelength of the laser is about 10.6 micrometers. The diameter of the laser spot is about 3 millimeters. The power density of the laser is about $0.053 \times 10^{12}$ watts per square meter. The irradiating time is less than 1.8 second.

The parameter of the laser should be selected according to the material of the first epitaxial layer 104 so that the first epitaxial layer 104 will not decompose. For example, if the first epitaxial layer 104 includes a low-temperature GaN buffer layer and a high-temperature GaN epitaxial layer, the laser with wavelength of 248 nanometers should not be used to heat and remove the first carbon nanotube layer 102 because the low-temperature GaN buffer layer can absorb the laser with wavelength of 248 nanometers and decompose to form Ga and $N_2$ easily.

If the substrate 100 is opaque, the substrate 100 will be heated and heat will be conducted to the first carbon nanotube layer 102. If the inner wall of the first caves 103 is spaced from the carbon nanotubes of the first carbon nanotube layer 102, the first caves 103 can be filled with oxygen gas or air gas. Thus, the first carbon nanotube layer 102 is easily oxidized. If the substrate 100 is transparent, the laser can pass through the substrate 100 to irradiate the first carbon nanotube layer 102 directly. The first carbon nanotube layer 102 can absorb the laser and oxidize easily. The laser beam can be irradiated on the epitaxial structure preform and moved relative to the epitaxial structure preform. The laser beam can be moved along a direction parallel with or perpendicular with the aligning direction of the carbon nanotubes in the first carbon nanotube layer 102. The slower the laser beam moves relative to the epitaxial structure preform, more energy will be absorbed by the first carbon nanotube layer 102, and the shorter time the first carbon nanotube layer 102 will oxidize. In one embodiment, the speed of the laser beam moving relative to the epitaxial structure preform is less than 10 millimeters per second.

Step (612) can be performed by fixing the epitaxial structure preform and moving the laser beam to irradiate the entire substrate 100. Also, step (612) can be performed by fixing the laser beam and moving the epitaxial structure preform so the entire substrate 100 is irradiated by the laser beam.

In one embodiment, the first carbon nanotube layer 102 is removed by heating in a furnace, and the step (60) includes the following substeps:

step (621), placing the epitaxial structure preform in a furnace; and step (622), heating the furnace to a determined temperature.

In step (621), the furnace can be any furnace according to need. In one embodiment, the furnace is a resistance furnace filled with oxygen gas or air gas.

In step (622), the furnace is heated to a temperature above 600° C. In one embodiment, the furnace is heated to a temperature in a range from about 650° C. to about 1200° C.

Figure 23:
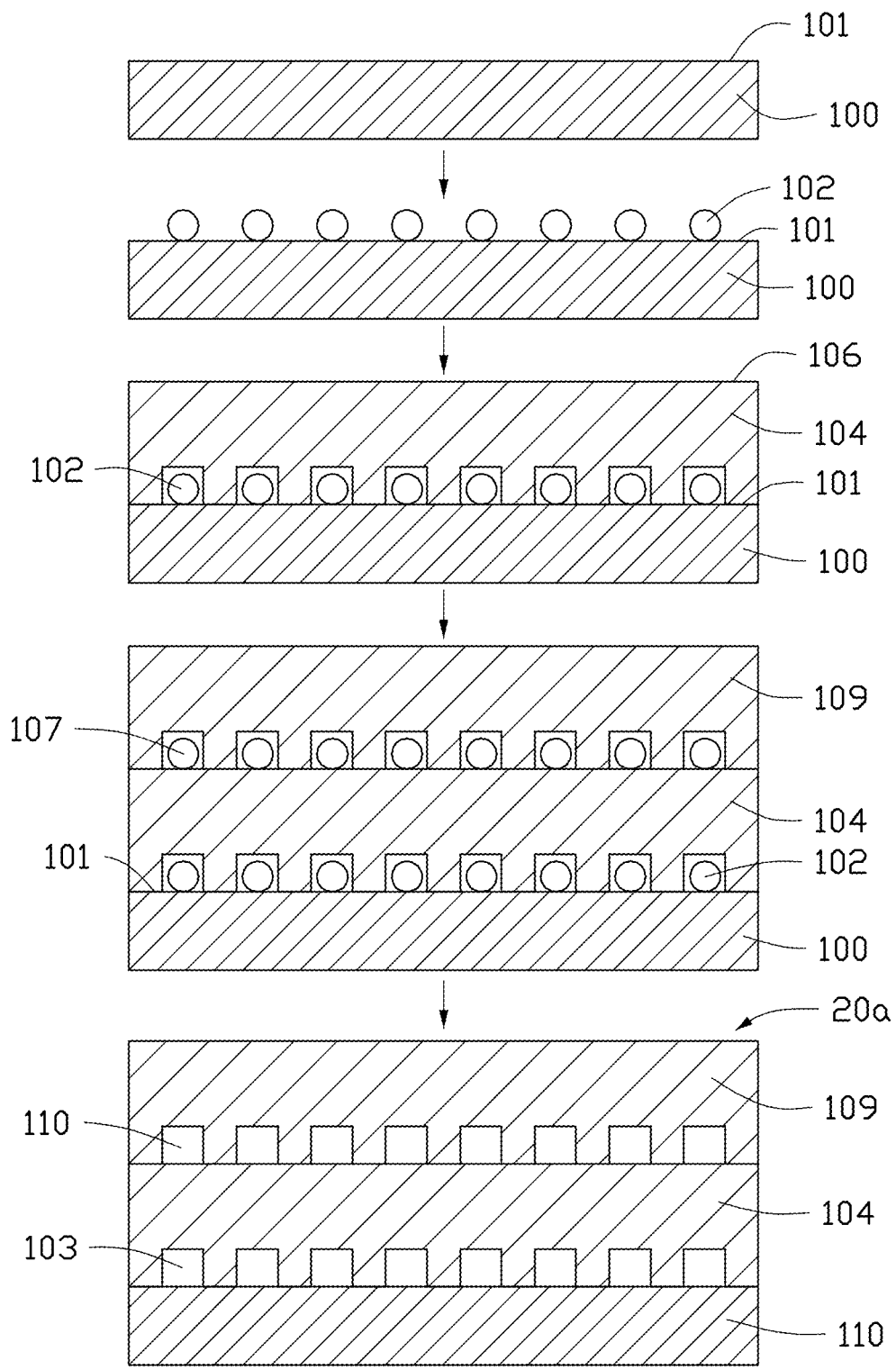
FIG. 23 is a flowchart of another embodiment of a method for making an epitaxial structure.

Referring to FIG. 23, a method for making an epitaxial structure 20a of one embodiment includes the following steps:

step (10), providing a substrate 100 having an epitaxial growth surface 101;

step (20), placing a first carbon nanotube layer 102 on the epitaxial growth surface 101;

step (30), epitaxially growing a first epitaxial layer 104 on the epitaxial growth surface 101;

step (40), placing a second carbon nanotube layer 107 on a surface 106 of the first epitaxial layer 104;

step (50), epitaxially growing a second epitaxial layer 109 on the first epitaxial layer 104; and step (60a), removing both the first carbon nanotube layer 102 and the second carbon nanotube layer 107.

The method for making an epitaxial structure 20a is similar to the method for making an epitaxial structure 10c described above except additional step (60a). The step (60a) can be performed by the methods provided in step (60) described above.

Figure 24:
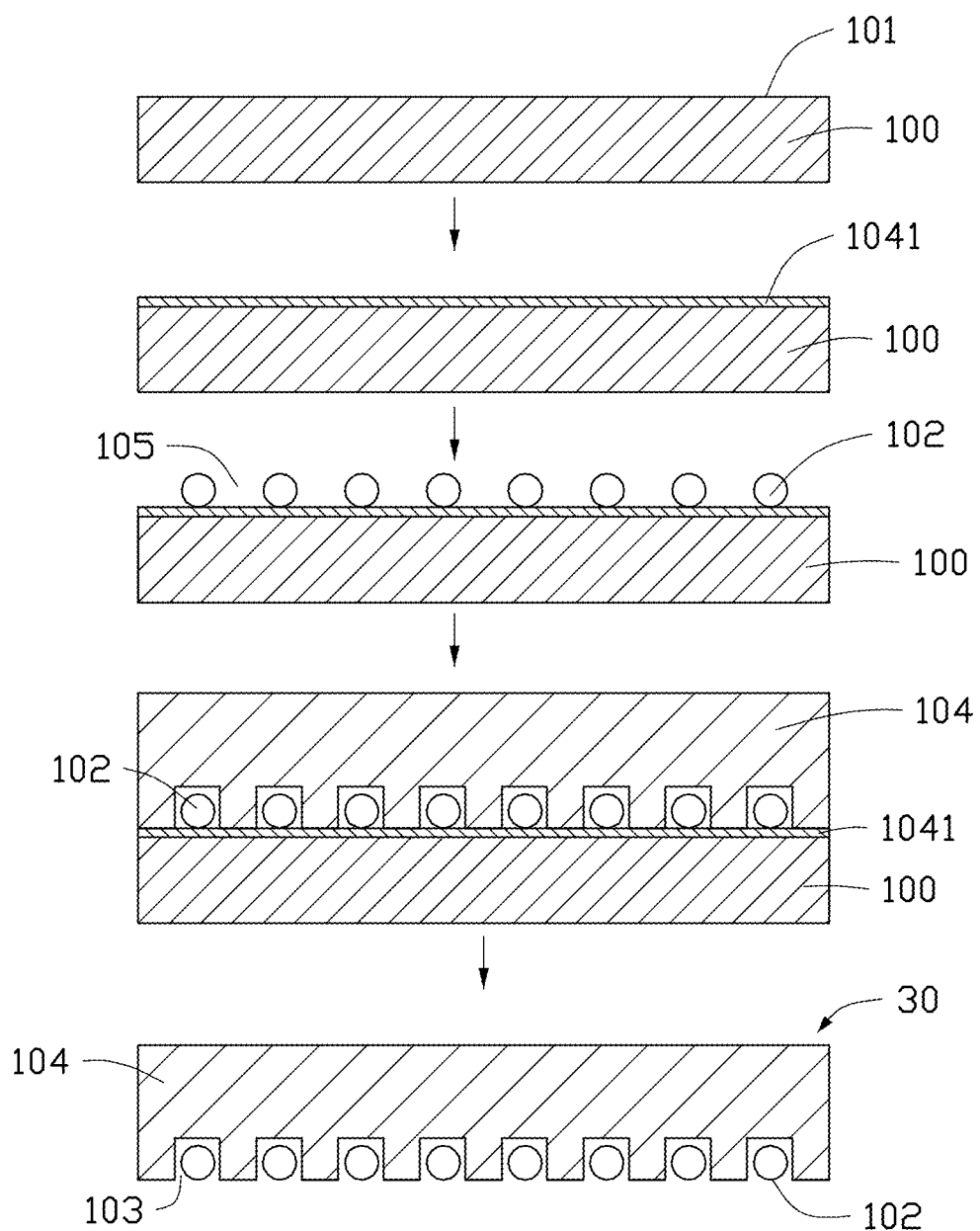
FIG. 24 is a flowchart of another embodiment of a method for making an epitaxial structure.

Referring to FIG. 24, a method for making an epitaxial structure 30 of one embodiment includes the following steps:

step (10), providing a substrate 100 having an epitaxial growth surface 101;

step (80), forming a buffer layer 1041 on the epitaxial growth surface 101;

step (20), placing a first carbon nanotube layer 102 on the buffer layer 1041;

step (30), forming an epitaxial structure preform by growing a first epitaxial layer 104 on the buffer layer 1041; and step (70), removing the substrate 100.

The method for making an epitaxial structure 30 is similar to the method for making an epitaxial structure 10 described above except additional steps (70) and (80).

In step (80), the buffer layer 1041 can be grown by the method of growing the first epitaxial layer 104 provided in step (30) described above. The thickness of the buffer layer 1041 can be in a range from about 10 nanometers to about 50 nanometers. The material of the buffer layer 1041 can be selected according to the material of the first epitaxial layer 104 and the substrate 100 so that the lattice mismatch between the first epitaxial layer 104 and the substrate 100 can be reduced.

In step (70), the substrate 100 can be removed by laser irradiation, corrosion, or thermal expansion and contraction. The method of removing the substrate 100 depends on the material of the buffer layer 1041, the material of the substrate 100, and the material of the first epitaxial layer 104.

In one embodiment, the substrate 100 is sapphire, the buffer layer 1041 is a low-temperature GaN layer, and the first epitaxial layer 104 is a high-temperature GaN layer. The substrate 100 is removed by laser irradiation and the step (70) includes the following substeps:

step (701), polishing and cleaning the surface of the substrate 100;

step (702), providing a laser beam to irradiate the substrate 100 and the first epitaxial layer 104; and step (703), placing the epitaxial structure preform in a solution.

In step (701), the surface of the substrate 100 can be polished by a mechanical polishing or chemical polishing so the substrate 100 has a smooth surface to reduce the scattering in laser irradiation. The surface of the substrate 100 can be cleaned using hydrochloric acid or sulfuric acid to remove the metal impurities and/or oil dirt thereon.

In step (702), the epitaxial structure preform is placed on a flat support in a vacuum or protective gas to prevent the first carbon nanotube layer 102 from oxidation. The protective gas can be nitrogen gas, helium gas, argon gas, or other inert gases.

The laser beam irradiates the polished surface of the substrate 100 substantially perpendicular to the polished surface. Thus, the laser beam can irradiate the interface between the substrate 100 and the first epitaxial layer 104. The wavelength of the laser beam can be selected according to the material of the buffer layer 1041 and the substrate 100 so the energy of the laser beam is less than the band-gap energy of the substrate 100 and greater than the band-gap energy of the buffer layer 1041. Thus, the laser beam can get through the substrate 100 to arrive at the buffer layer 1041. The buffer layer 1041 can absorb the laser beam and be heated to decompose rapidly. In one embodiment, the buffer layer 1041 is a low-temperature GaN layer with a band-gap energy of 3.3 electron volts, the substrate 100 is sapphire with a band-gap energy of 9.9 electron volts, and the laser beam has a wavelength of 248 nanometers, an energy of 5 electron volts, an impulse duration from about 20 ns to about 40 ns, and an energy density from about 0.4 joules per square centimeter to about 0.6 joules per square centimeter. The shape of the laser spot is square with a side length of about 0.5 millimeters. The laser spot can move relative to the substrate 100 with a speed of about 0.5 millimeters per second. After absorption of the laser beam, the low-temperature GaN buffer layer 1041 can decompose to Ga and $N_2$. The substrate 100 will not be damaged because only a small amount of the laser beam is absorbed.

In step (703), the epitaxial structure preform is immersed in an acid solution to remove the Ga decomposed from the GaN buffer layer 1041 so the substrate 100 is separated from the first epitaxial layer 104. The acid solution can be a hydrochloric acid, sulfuric acid, or nitric acid that can dissolve the Ga. Because the buffer layer 1041 is located between the first carbon nanotube layer 102 and the substrate 100, the first carbon nanotube layer 102 will remain on the first epitaxial layer 104 after the substrate 100 is separated from the first epitaxial layer 104. Because the buffer layer 1041 is decomposed by laser irradiation and removed by immersing in acid solution, the first carbon nanotube layer 102 will remain in the first caves 103. Furthermore, the $N_2$ decomposed from the GaN buffer layer 1041 will expand and separate the first carbon nanotube layer 102 from the substrate 100 easily. Because the first carbon nanotube layer 102 allows the first epitaxial layer 104 and the buffer layer 1041 to have a relative small contacting surface, the substrate 100 can be separated from the first epitaxial layer 104 easily and the damage on the first epitaxial layer 104 will be reduced.

In one embodiment, the substrate 100 is SiC, the buffer layer 1041 is an AlN layer or a TiN layer, the first epitaxial layer 104 is high-temperature GaN layer. The substrate 100 is removed by corroding the buffer layer 1041 in a corrosion solution. The corrosion solution can dissolve the buffer layer 1041 and the substrate 100 but cannot dissolve the first epitaxial layer 104. The corrosion solution can be NaOH solution, KOH solution, or $NH_4OH$ solution. In one embodiment, the corrosion solution is NaOH solution with a mass concentration from about 30% to about 50%. The epitaxial structure preform is immersed in the NaOH solution for about 2 minutes to about 10 minutes. The NaOH solution enters the first caves 103 to corrode the AlN buffer layer 1041 so the substrate 100 is separated from the first epitaxial layer 104. If the buffer layer 1041 is a TiN layer, the corrosion solution can be a nitric acid.

Furthermore, the substrate 100 can also be dissolved by a corrosion solution directly. Thus, the step of growing the buffer layer 1041 can be omitted. Because the first carbon nanotube layer 102 allows the first epitaxial layer 104 and the buffer layer 1041 to have a relative small contacting surface and a plurality of first caves 103 are located between the first epitaxial layer 104 and the buffer layer 1041, the corrosion solution can spread on the buffer layer 1041 rapidly and uniformly. Thus, the substrate 100 can be separated from the first epitaxial layer 104 easily and the damage on the first epitaxial layer 104 can be reduced.

In one embodiment, the substrate 100 is sapphire, the buffer layer 1041 is a low-temperature GaN layer, and the first epitaxial layer 104 is a high-temperature GaN layer. The substrate 100 is removed due to thermal expansion and contraction. The epitaxial structure preform is heated to a high temperature above 1000° C. and cooled to a low temperature below 1000° C. in a short time such as from 2 minutes to about 20 minutes. The substrate 100 is separated from the first epitaxial layer 104 by cracking because of the thermal expansion mismatch between the substrate 100 and the first epitaxial layer 104. The epitaxial structure preform can also be heated by applying an electrical current to the first carbon nanotube layer 102. After the epitaxial structure preform cracks, the substrate 100 can be removed by moving along a direction parallel with the surface of the first carbon nanotube layer 102 so the first carbon nanotube layer 102 can remain on the first epitaxial layer 104.

Figure 25:
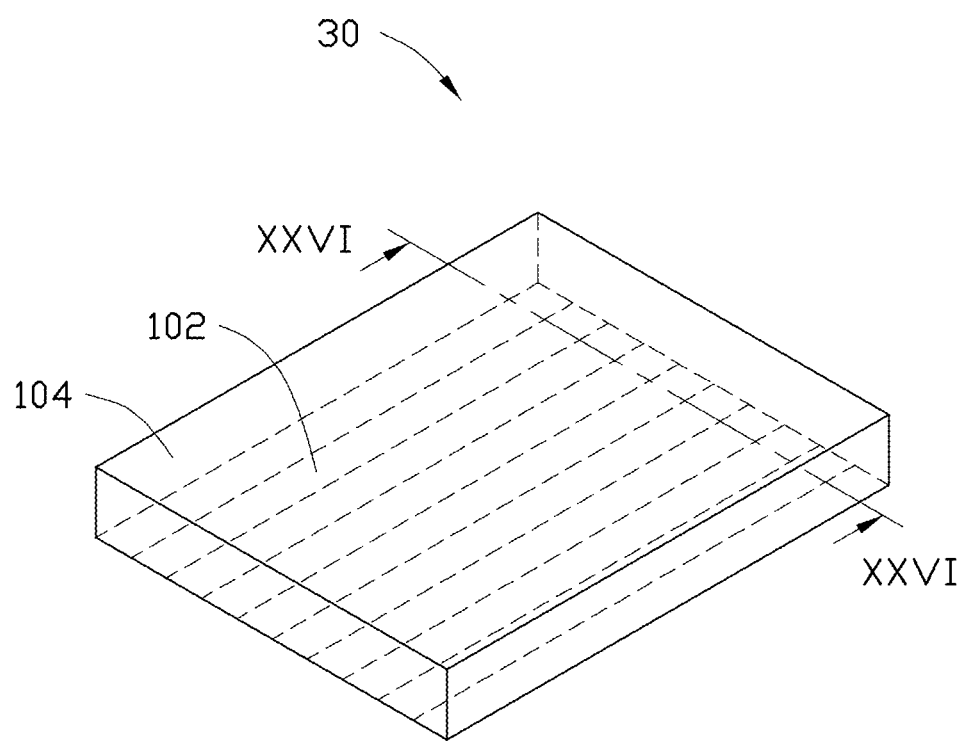
FIG. 25 is a schematic view of one embodiment of an epitaxial structure fabricated in the method of FIG. 24.
Figure 26:
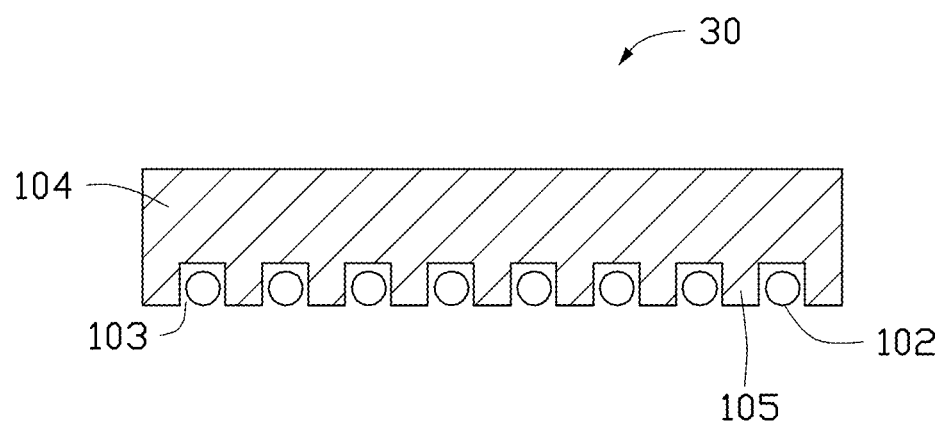
FIG. 26 is a schematic, cross-sectional view, along a line XXVI-XXVI of FIG. 25.

Referring to FIGS. 25 and 26, an epitaxial structure 30 provided in one embodiment includes a first epitaxial layer 104 having a patterned surface, and a first carbon nanotube layer 102 located on the patterned surface. The first carbon nanotube layer 102 is patterned and defines a plurality of first apertures 105 so a part of the first epitaxial layer 104 protrudes from the first apertures 105. The patterned surface of the epitaxial layer 104 defines a plurality of first caves 103. The carbon nanotubes of the first carbon nanotube layer 102 are enclosed in the first caves 103. The first caves 103 are blind holes or grooves so a part of the first carbon nanotube layer 102 is exposed.

Furthermore, a step of removing the first carbon nanotube layer 102 can be performed after the step (70). The first carbon nanotube layer 102 can be removed by the method provided in step (60), or other methods such as cleaning by ultrasonic treatment, peeling by an adhesive tape, polishing by a brush, or combinations thereof.

Figure 27:
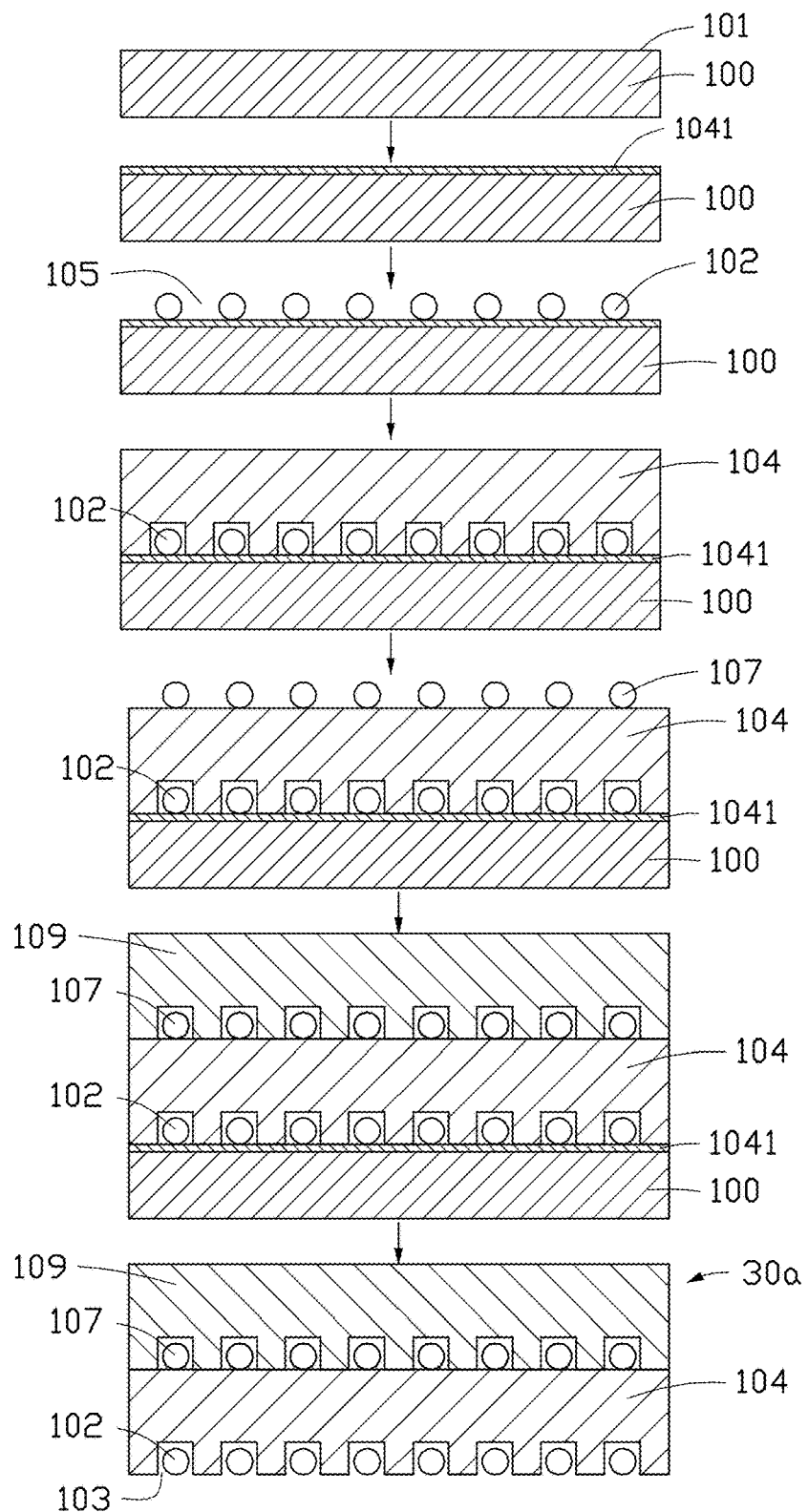
FIG. 27 is a flowchart of another embodiment of a method for making an epitaxial structure.

Referring to FIG. 27, a method for making an epitaxial structure 30a of one embodiment includes the following steps:

step (10), providing a substrate 100 having an epitaxial growth surface 101;

step (80), forming a buffer layer 1041 on the epitaxial growth surface 101;

step (20), placing a first carbon nanotube layer 102 on the epitaxial growth surface 101;

step (30), epitaxially growing a first epitaxial layer 104 on the epitaxial growth surface 101;

step (40), placing a second carbon nanotube layer 107 on a surface 106 of the first epitaxial layer 104;

step (50), epitaxially growing a second epitaxial layer 109 on the first epitaxial layer 104; and step (70), removing the substrate 100.

The method for making an epitaxial structure 30a is similar to the method for making an epitaxial structure 10c described above except that step (80) is performed after step (10), and step (70) after step (50).

Figure 28:
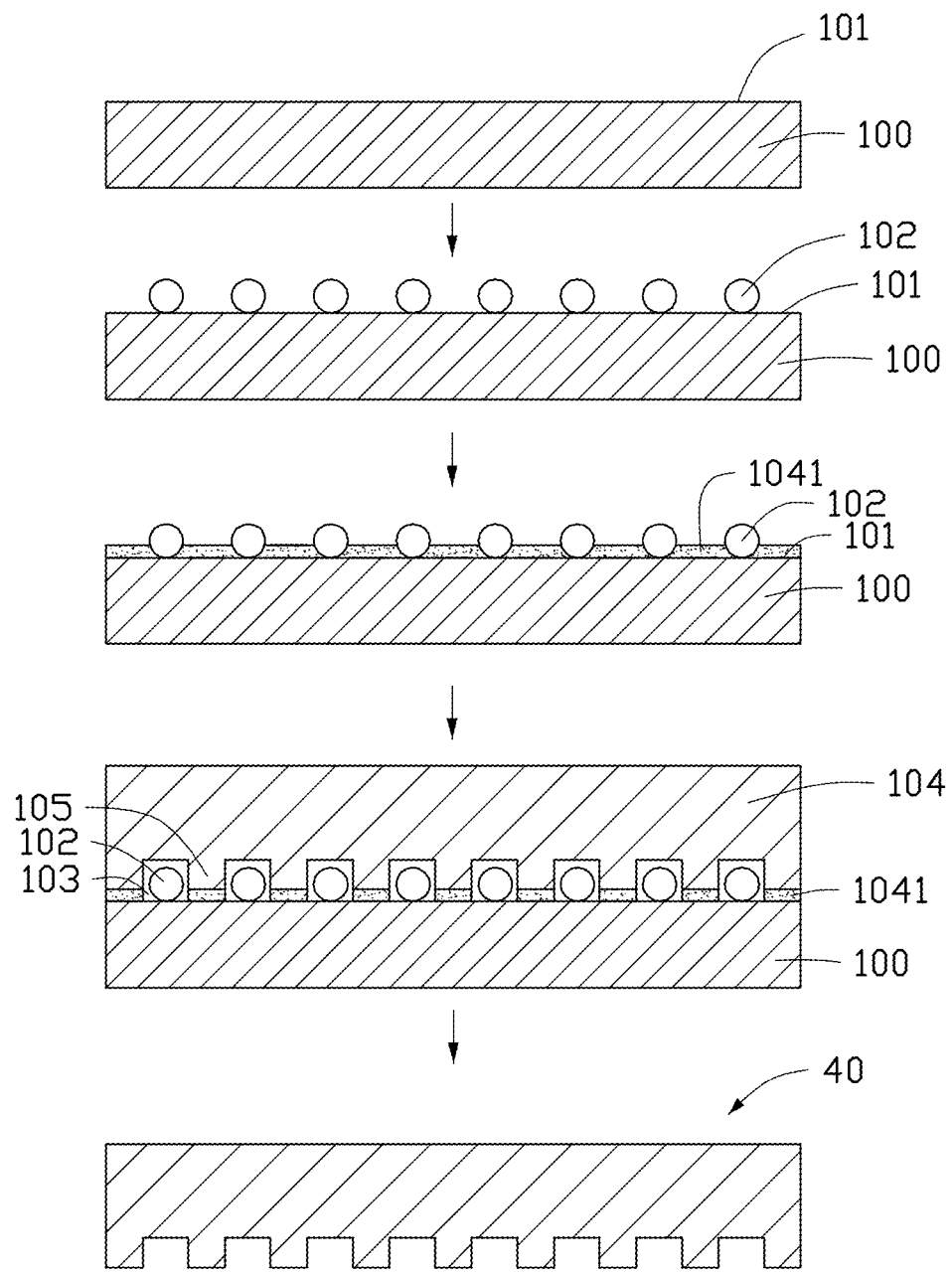
FIG. 28 is a flowchart of another embodiment of a method for making an epitaxial structure.

Referring to FIG. 28, a method for making an epitaxial structure 40 of one embodiment includes the following steps:

step (10), providing a substrate 100 having an epitaxial growth surface 101;

step (20), placing a first carbon nanotube layer 102 on the epitaxial growth surface 101;

step (80), forming a buffer layer 1041 on the epitaxial growth surface 101;

step (30), epitaxially growing a first epitaxial layer 104 on the buffer layer 1041; and step (70a), removing both the substrate 100 and the first carbon nanotube layer 102.

The method for making an epitaxial structure 40 is similar to the method for making an epitaxial structure 30 described above except that step (80) is performed after step (20), and both the substrate 100 and the first carbon nanotube layer 102 are removed after step (30). Because both the substrate 100 and the first carbon nanotube layer 102 are removed after step (30), the buffer layer 1041 can be formed on the epitaxial growth surface 101 after step (20) and before step (30). Thus, the first carbon nanotube layer 102 can be attached on the substrate 100 and will be removed with the substrate 100 together in step (70a).

Figure 29:
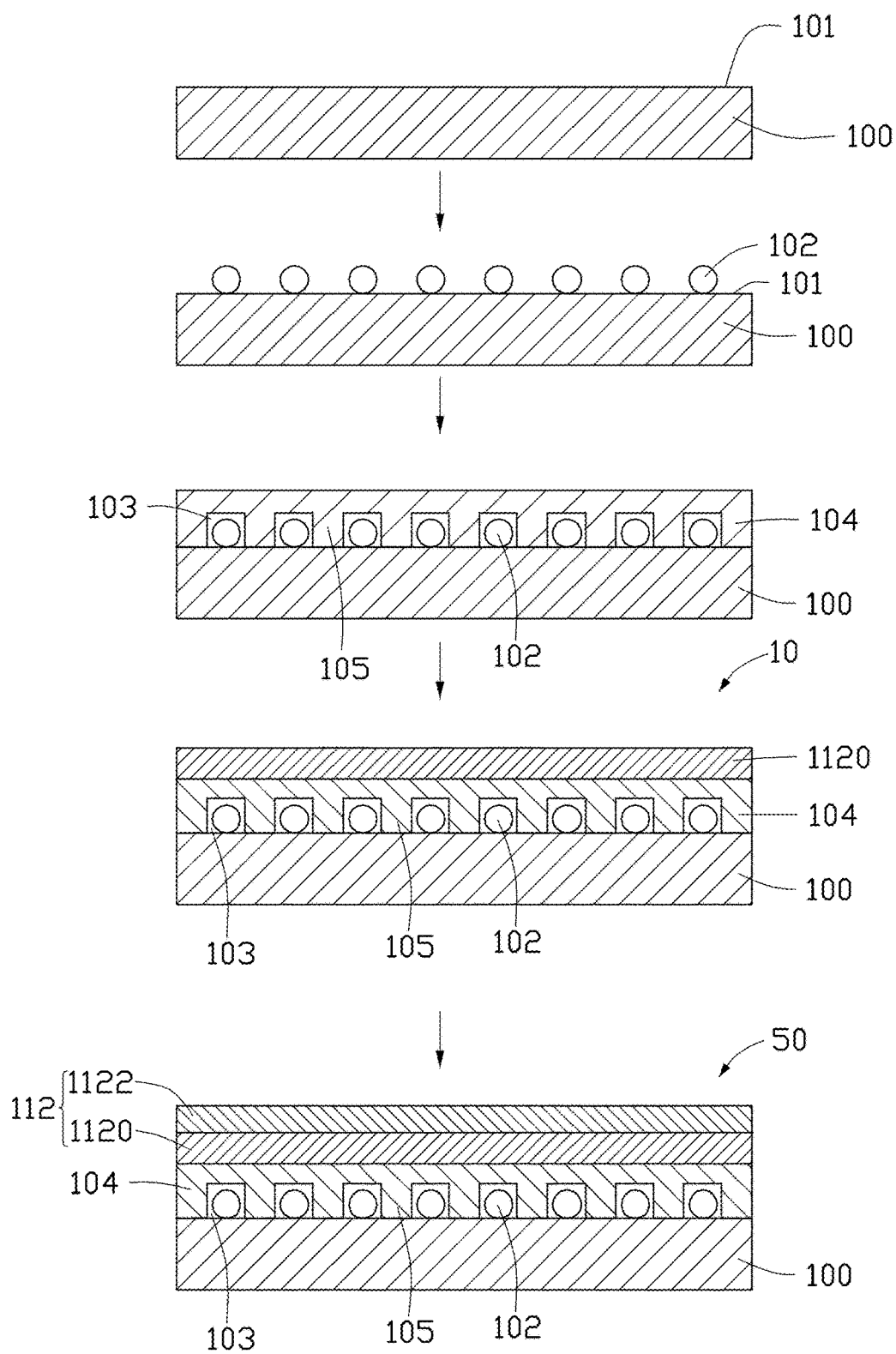
FIG. 29 is a flowchart of another embodiment of a method for making an epitaxial structure.

Referring to FIG. 29, a method for making an epitaxial structure 50 of one embodiment includes the following steps:

step (10), providing a substrate 100 having an epitaxial growth surface 101;

step (20), placing a first carbon nanotube layer 102 on the epitaxial growth surface 101;

step (30), epitaxially growing a first epitaxial layer 104 on the epitaxial growth surface 101, wherein the first epitaxial layer 104 is an intrinsic semiconductor epitaxial layer; and step (90), growing a doped semiconductor epitaxial layer 112 on the first epitaxial layer 104.

The method for making an epitaxial structure 50 is similar to the method for making an epitaxial structure 10 described above except that the first epitaxial layer 104 is an intrinsic semiconductor epitaxial layer, and additional step (90).

In step (90), the doped semiconductor epitaxial layer 112 can be grown on the first epitaxial layer 104 by introducing a gas containing the doping elements in the source gas for growing intrinsic semiconductor epitaxial layer. The doped semiconductor epitaxial layer 112 can be an N-type doped semiconductor epitaxial layer or a P-type doped semiconductor epitaxial layer. In one embodiment, the doped semiconductor epitaxial layer 112 includes an N-type doped semiconductor epitaxial layer 1120 and a P-type doped semiconductor epitaxial layer 1122 to form a PN junction. In one embodiment, an active layer (not shown) can be formed between the N-type doped semiconductor epitaxial layer 1120 and the P-type doped semiconductor epitaxial layer 1122. The active layer can be a single-layer quantum well structure or multiple-layer quantum well structure. In one embodiment, a highly doped semiconductor electrode contacting layer (not shown) can be formed on a surface of the PN junction away from the substrate 100. Furthermore, a process of annealing the doped semiconductor epitaxial layer 112 can be performed to activate the doping elements of the doped semiconductor epitaxial layer 112.

In another embodiment, the gas containing the doping elements is introduced in the source gas for growing the first epitaxial layer 104, and a doped semiconductor epitaxial layer can be grown on the epitaxial growth surface 101 directly.

In another embodiment, if the first epitaxial layer 104 is an intrinsic semiconductor epitaxial layer, a step of forming a doped semiconductor epitaxial layer can be performed after the step (30) by doping the intrinsic semiconductor epitaxial layer. The intrinsic semiconductor epitaxial layer can be doped by thermal diffusion or ion implantation.

Figure 30:
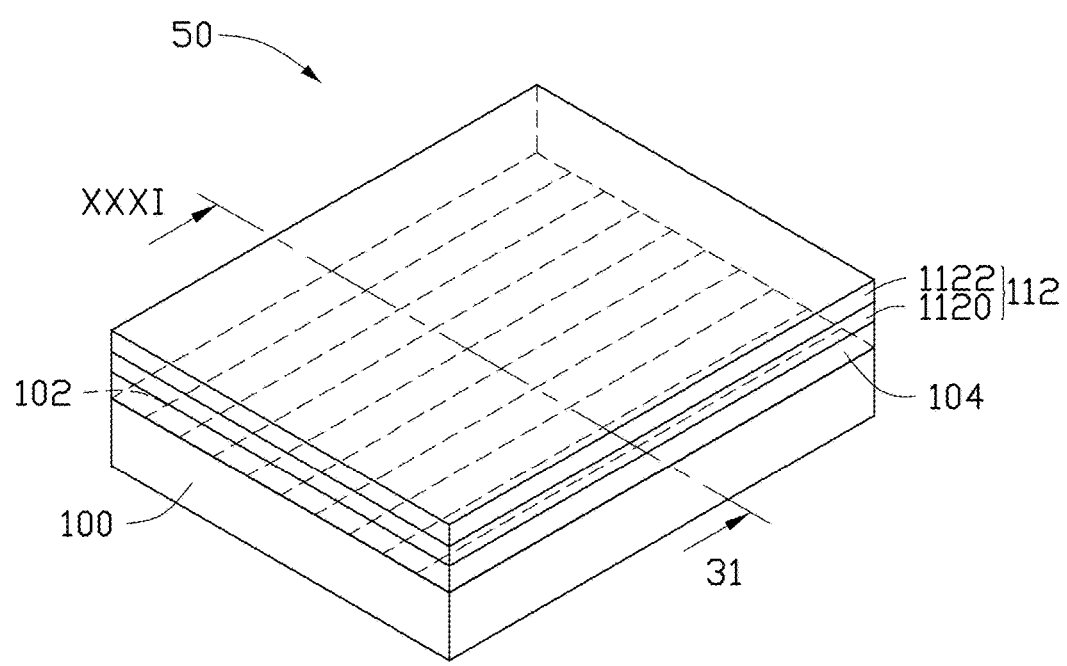
FIG. 30 is a schematic view of one embodiment of an epitaxial structure fabricated in the method of FIG. 29.
Figure 31:
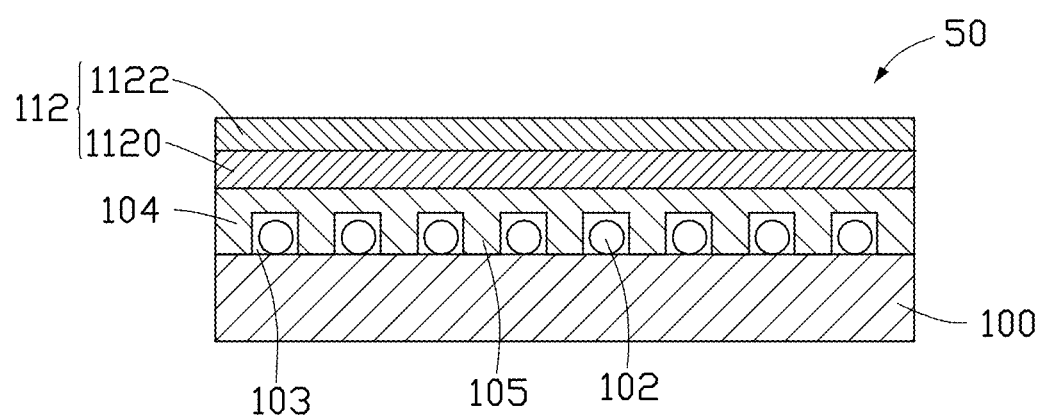
FIG. 31 is a schematic, cross-sectional view, along a line XXXI-XXXI of FIG. 30.

Referring to FIGS. 30 and 31, an epitaxial structure 50 provided in one embodiment includes a substrate 100, a first carbon nanotube layer 102, and a first epitaxial layer 104, and a doped semiconductor epitaxial layer 112. The epitaxial structure 50 is similar to the epitaxial structure 10 described above except that the first epitaxial layer 104 is an intrinsic semiconductor epitaxial layer and a doped semiconductor epitaxial layer 112 is formed on the intrinsic semiconductor epitaxial layer. The doped semiconductor epitaxial layer 112 includes an N-type doped semiconductor epitaxial layer 1120 and a P-type doped semiconductor epitaxial layer 1122 to form a PN junction. In one embodiment, an active layer (not shown) can be formed between the N-type doped semiconductor epitaxial layer 1120 and the P-type doped semiconductor epitaxial layer 1122. The active layer can be a single-layer quantum well structure or multiple-layer quantum well structure. Also, a highly doped semiconductor electrode contacting layer (not shown) can be formed on a surface of the PN junction away from the substrate 100. In one embodiment, the intrinsic semiconductor epitaxial layer 104 can be omitted, and the doped semiconductor epitaxial layer 112 can be located on and contacting the epitaxial growth surface 101.

Figure 32:
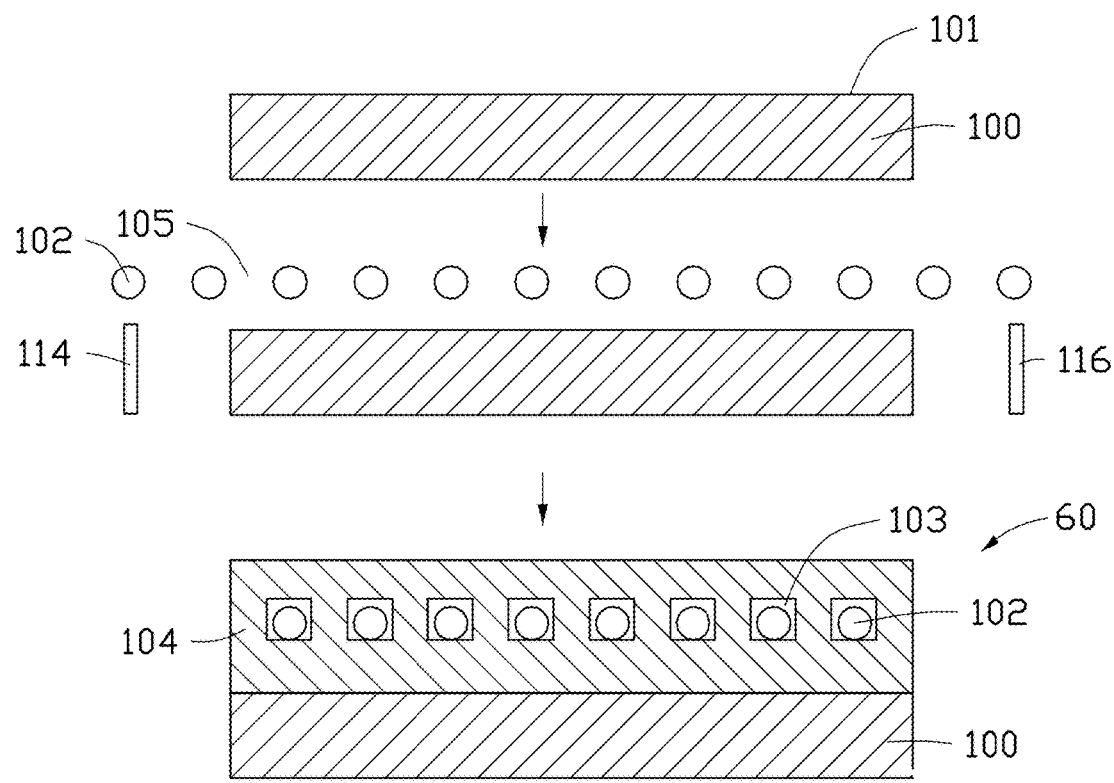
FIG. 32 is a flowchart of another embodiment of a method for making an epitaxial structure.

Referring to FIG. 32, a method for making an epitaxial structure 60 of one embodiment includes the following steps:

step (10), providing a substrate 100 having an epitaxial growth surface 101;

step (20a), suspending a first carbon nanotube layer 102 above the epitaxial growth surface 101; and step (30), epitaxially growing a first epitaxial layer 104 on the epitaxial growth surface 101.

The method for making an epitaxial structure 60 is similar to the method for making an epitaxial structure 10 described above except that in step (20a), the first carbon nanotube layer 102 is suspended above the epitaxial growth surface 101.

In step (20a), the first carbon nanotube layer 102 is a free-standing structure. The first carbon nanotube layer 102 is spaced from and extends along a direction parallel with the epitaxial growth surface 101. The first carbon nanotube layer 102 can cover the entire epitaxial growth surface 101 or have an area smaller than the area of the epitaxial growth surface 101. The carbon nanotubes of the first carbon nanotube layer 102 are arranged along a direction substantially parallel with the epitaxial growth surface 101. The distance between the first carbon nanotube layer 102 and the epitaxial growth surface 101 can be selected according to need, such as in a range from about 10 nanometers to about 500 micrometers. In one embodiment, the distance between the first carbon nanotube layer 102 and the epitaxial growth surface 101 is in a range from about 50 nanometers to about 100 micrometers, such as about 10 micrometers. Thus, the first epitaxial layer 104 can grow through the first apertures 105 of the first carbon nanotube layer 102 and enclose the first carbon nanotube layer 102 therein. The first carbon nanotube layer 102 can prevent a part of the first epitaxial layer 104 from epitaxially growing vertically and cause the first epitaxial layer 10 to lateral epitaxially grow laterally. Thus, the lattice mismatch between the substrate 100 and the first epitaxial layer 104 can be reduced and the quality of the first epitaxial layer 104 can be improved.

In one embodiment, the step (20a) includes the following substeps:

step (201), providing a first support 114 and a second support 116 and placing the first support 114 and the second support 116 spaced from each other;

step (202), placing the substrate 100 between the first support 114 and the second support 116; and step (203), placing the first carbon nanotube layer 102 on the first support 114 and the second support 116.

In step (201), the first support 114 and the second support 116 can be made of a material such as metal, alloy, polymer, glass, or ceramic. The distance between the first support 114 and the second support 116 can be selected according to need. In one embodiment, the distance between the first support 114 and the second support 116 is greater than the size of the substrate 100 so the suspended first carbon nanotube layer 102 can cover the entire epitaxial growth surface 101.

In step (202), the height of the first support 114 and the second support 116 is higher than the thickness of the substrate 100.

In step (203), one side of the first carbon nanotube layer 102 can be attached on the first support 114 and the other opposite side can be attached on the second support 116. The part of the first carbon nanotube layer 102 between the first support 114 and the second support 116 is tightened and suspended. The carbon nanotubes of the first carbon nanotube layer 102 are arranged to extend from the first support 114 to the second support 116. The first carbon nanotube layer 102 can be fixed on the first support 114 and the second support 116 by a conductive adhesive.

In step (30), the first epitaxial layer 104 starts growing from the epitaxial growth surface 101. When the first epitaxial layer 104 grows to the first carbon nanotube layer 102, the first epitaxial layer 104 can only grow vertically through the first apertures 105 of the first carbon nanotube layer 102 and then laterally grows and joins together to enclose the first carbon nanotube layer 102 therein. Thus, a plurality of first caves 103 is formed in the first epitaxial layer 104. The first caves 103 can join together to form a pattern same as the pattern of the first carbon nanotube layer 102. Furthermore, a voltage can be supplied to between the first support 114 and the second support 116 so that the first carbon nanotube layer 102 can produce heat to heat the substrate 100. Thus, the quality of the first epitaxial layer 104 can be improved.

Figure 33:
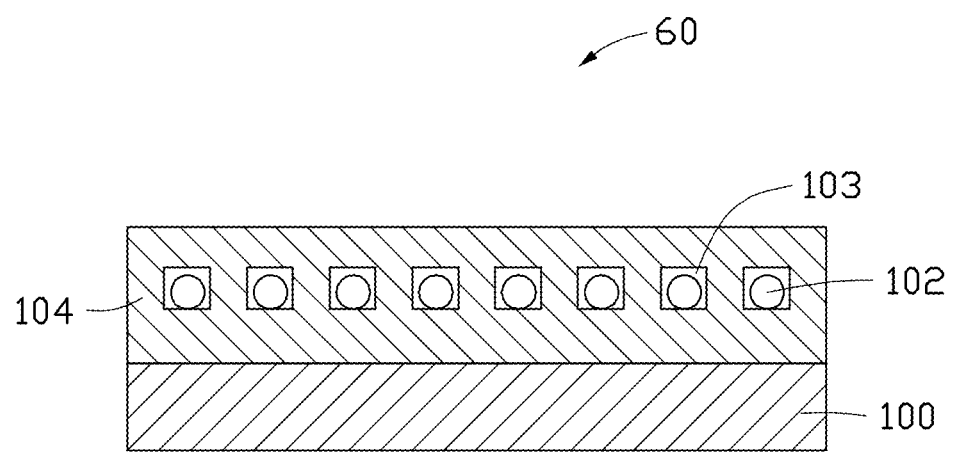
FIG. 33 is a schematic view of one embodiment of an epitaxial structure fabricated in the method of FIG. 32.

Referring to FIG. 33, an epitaxial structure 60 provided in one embodiment includes a substrate 100, a first carbon nanotube layer 102, and a first epitaxial layer 104. The epitaxial structure 30 is similar to the epitaxial structure 10 described above except that the first carbon nanotube layer 102 is located in and enclosed by the first epitaxial layer 104. The first epitaxial layer 104 defines a plurality of first caves 103 therein. The first caves 103 are arranged in a plane. The carbon nanotubes of the first carbon nanotube layer 102 are located in the first caves 103. If the first carbon nanotube layer 102 includes a layer of parallel and spaced carbon nanotube wires, the first caves 103 are a plurality of parallel and spaced tunnels. If the first carbon nanotube layer 102 includes a plurality of carbon nanotube wires crossed or weaved together to form a carbon nanotube net, the first caves 103 are a plurality of intersected tunnels interconnected with each other. The cross section of the tunnel can be round with a diameter in a range from about 2 nanometers to about 200 micrometers. In one embodiment, the diameter of the tunnel is in a range from about 2 nanometers to about 200 nanometers.

Figure 34:
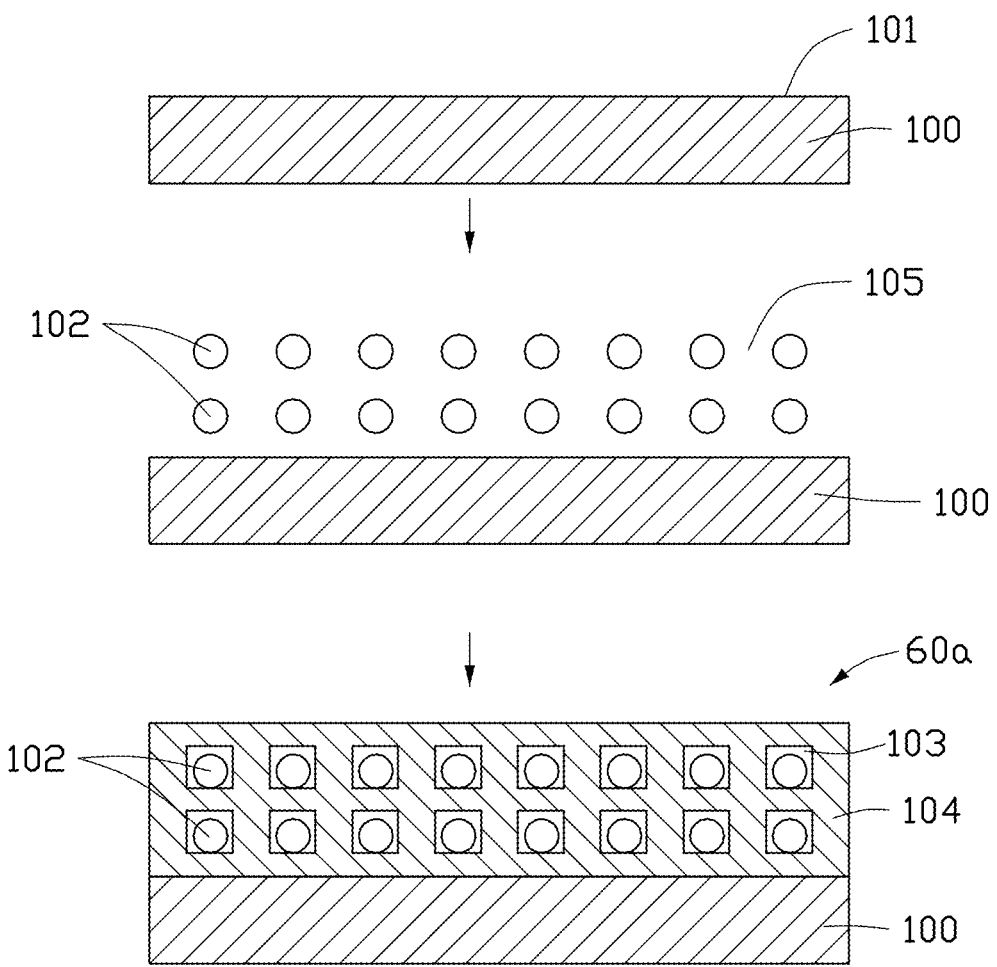
FIG. 34 is a flowchart of another embodiment of a method for making an epitaxial structure.
Figure 35:
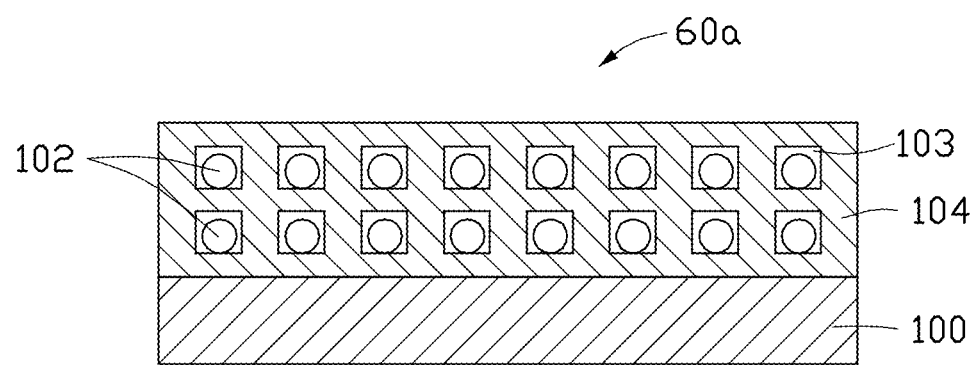
FIG. 35 is a schematic view of one embodiment of an epitaxial structure fabricated in the method of FIG. 34.

Furthermore, as shown in FIG. 34, in one embodiment, the two first carbon nanotube layers 102 are suspended above the epitaxial growth surface 101 in step (20a). The two first carbon nanotube layers 102 are parallel with and spaced from each other. The distance between the two first carbon nanotube layers 102 is in a range from about 10 nanometers to about 500 micrometers. Also, more than two first carbon nanotube layers 102 can be suspended above the epitaxial growth surface 101. The more than two first carbon nanotube layers 102 can be suspended equidistantly. As shown in FIG. 35, an epitaxial structure 60a provided in one embodiment includes a substrate 100, a first epitaxial layer 104 located on the substrate 100, and two first carbon nanotube layers 102 located in the first epitaxial layer 104 and spaced from each other. The epitaxial structure 30 can also include more than two first carbon nanotube layers 102 located in the first epitaxial layer 104 equidistantly.

Figure 36:
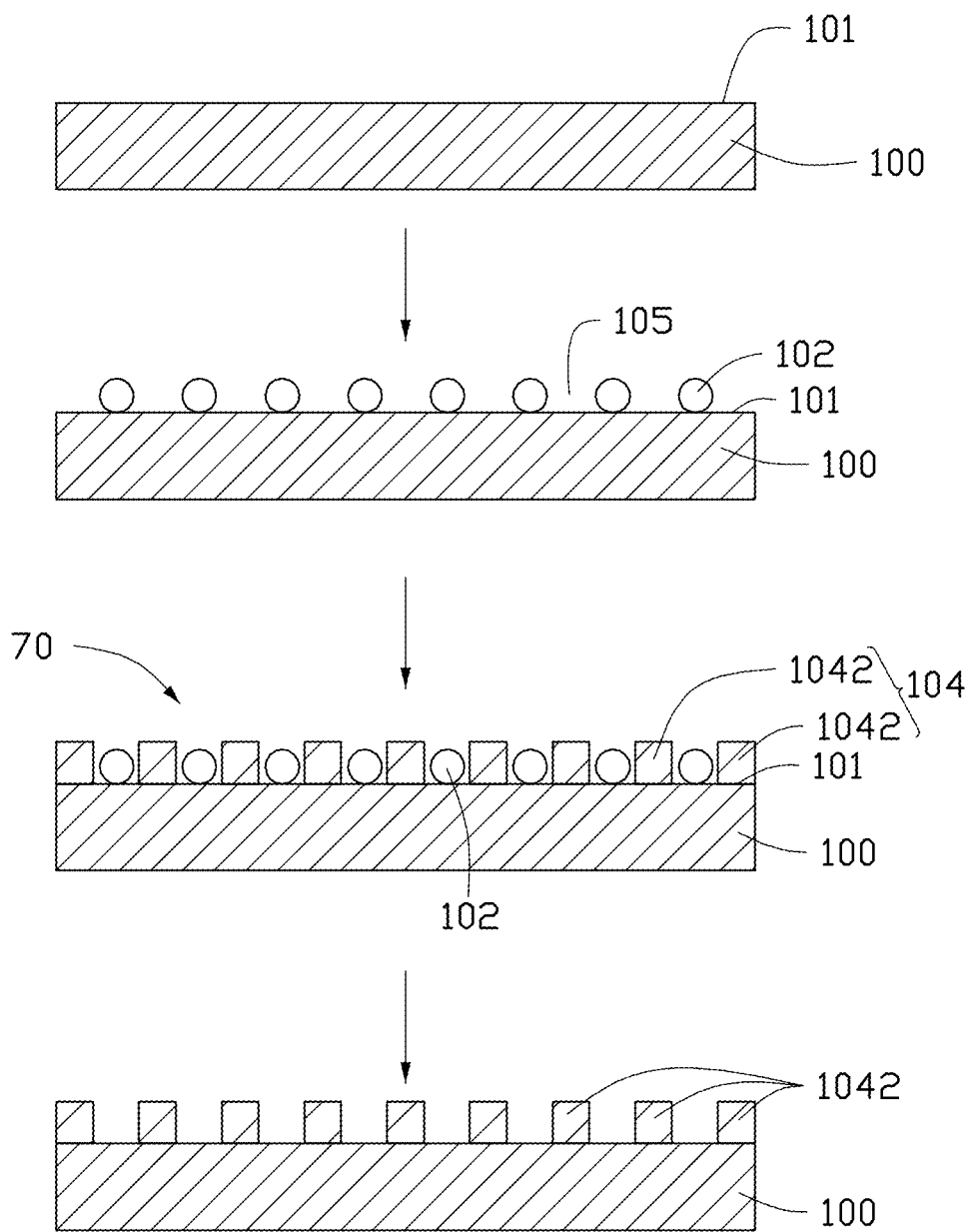
FIG. 36 is a flowchart of another embodiment of a method for making an epitaxial structure.

Referring to FIG. 36, a method for making an epitaxial structure 70 of one embodiment includes the following steps:

step (10), providing a substrate 100 having an epitaxial growth surface 101;

step (20), placing a first carbon nanotube layer 102 on the epitaxial growth surface 101; and step (30a), epitaxially growing a first epitaxial layer 104 on the epitaxial growth surface 101, wherein the first epitaxial layer 104 only includes a plurality of epitaxial crystal grains 1042 spaced from each other.

The method for making an epitaxial structure 70 is similar to the method for making an epitaxial structure 10 described above except that in step (30a), the plurality of epitaxial crystal grains 1042 are not joined together to form an continuous integral structure to cover the first carbon nanotube layer 102.

In step (30a), the epitaxial crystal grains 1042 grow substantially vertically from the exposed epitaxial growth surface 101 and through the first apertures 105. The thickness of the first epitaxial layer 104 can be controlled by controlling the growing time so that a plurality of spaced epitaxial crystal grains 1042 can be obtained, not a continuous film. The plurality of epitaxial crystal grains 1042 define a patterned space there between. The first carbon nanotube layer 102 is located in the patterned space. The patterned space has the same pattern as the patterned first carbon nanotube layer 102. If the first carbon nanotube layer 102 includes a layer of substantially parallel and spaced carbon nanotube wires, the patterned space is a plurality of substantially parallel and spaced grooves. If the first carbon nanotube layer 102 includes a plurality of carbon nanotube wires crossed or weaved together to form a carbon nanotube net, the patterned space is a plurality of intersected grooves.

Furthermore, a step of removing the first carbon nanotube layer 102 can be performed after the step (30a). The first carbon nanotube layer 102 can be removed by the method provided in step (60), or other methods such as peeling by ultrasonic treatment, peeling by an adhesive tape, polishing by a brush, or combinations there of.

Figure 37:
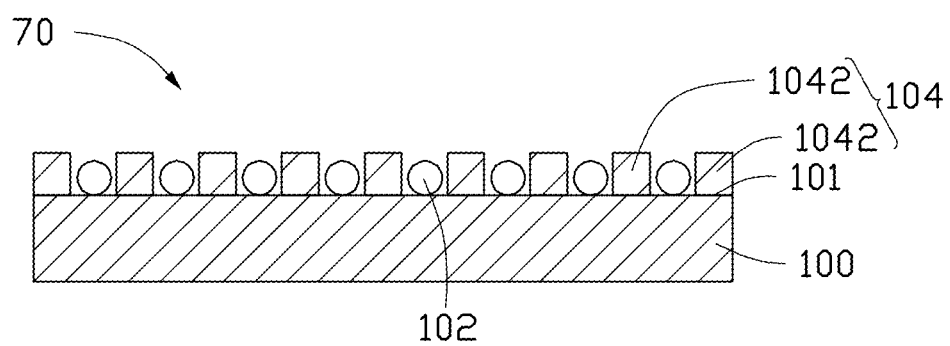
FIG. 37 is a schematic view of one embodiment of an epitaxial structure fabricated in the method of FIG. 36.

Referring to FIG. 37, an epitaxial structure 70 provided in one embodiment includes a substrate 100, a first carbon nanotube layer 102, and a first epitaxial layer 104. The first epitaxial layer 104 includes a plurality of epitaxial crystal grains 1042 spaced from each other and defines a patterned space. The first carbon nanotube layer 102 is located in the patterned space. The patterned space has the same pattern as the patterned first carbon nanotube layer 102. The shape of the epitaxial crystal grains 1042 depends on the shape of the first openings 105. If the first opening 105 is a round hole, the epitaxial crystal grains 1042 can be a cylinder. If the first opening 105 is a gap, the epitaxial crystal grains 1042 can be cuboid.

Figure 38:
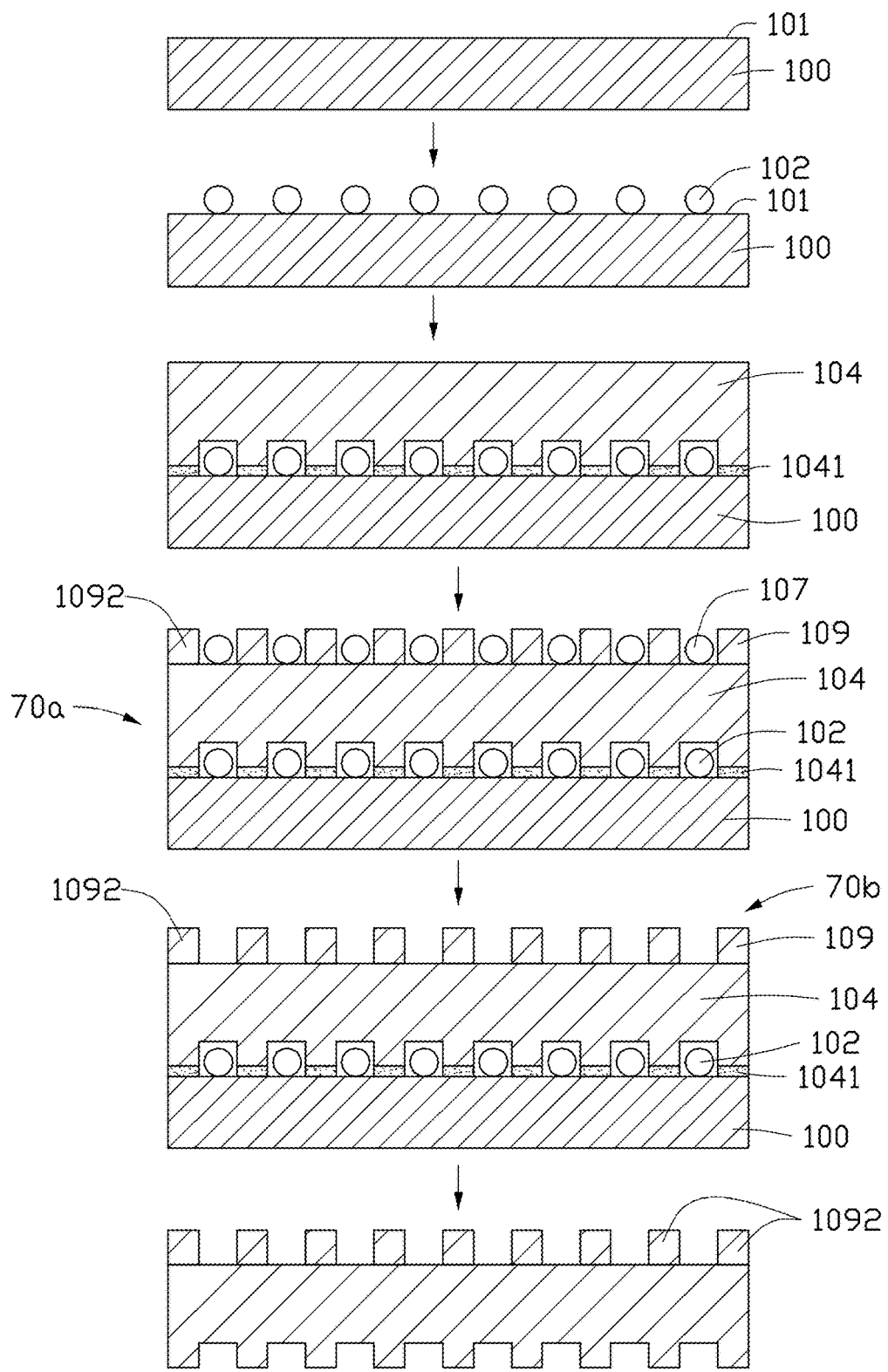
FIG. 38 is a flowchart of another embodiment of a method for making an epitaxial structure.

Referring to FIG. 38, a method for making an epitaxial structure 70a of one embodiment includes the following steps:

step (10), providing a substrate 100 having an epitaxial growth surface 101;

step (20), placing a first carbon nanotube layer 102 on the epitaxial growth surface 101;

step (80), forming a buffer layer 1041 on the epitaxial growth surface 101;

step (30), epitaxially growing a first epitaxial layer 104 on the epitaxial growth surface 101;

step (40), placing a second carbon nanotube layer 107 on a surface 106 of the first epitaxial layer 104; and step (50a), epitaxially growing a second epitaxial layer 109 on the first epitaxial layer 104, wherein the second epitaxial layer 109 only includes a plurality of epitaxial crystal grains 1092 spaced from each other.

The method for making an epitaxial structure 70a is similar to the method for making an epitaxial structure 20a described above except that a step (80) of forming a buffer layer 1041 on the epitaxial growth surface 101 is performed after step (20) and before step (30), and in step (50a) the plurality of epitaxial crystal grains 1092 are not joined together to form an continuous integral structure to cover the first carbon nanotube layer 102.

Furthermore, a step of removing the second carbon nanotube layer 107 can be performed after the step (50a) to obtain an epitaxial structure 70b as shown in FIG. 38. The second carbon nanotube layer 107 can be removed by the method provided in step (60), or other methods such as peeling by ultrasonic treatment, peeling by an adhesive tape, polishing by a brush, or combinations thereof.

Furthermore, a step of removing the substrate 100 and the first carbon nanotube layer 102 can be performed to obtain an epitaxial structure 70c as shown in FIG. 38. The substrate 100 can be removed by the method provided in step (70).

The first carbon nanotube layer 102 can be removed by the method provided in step (60). Also the substrate 100 and the first carbon nanotube layer 102 can be removed together.

Figure 39:
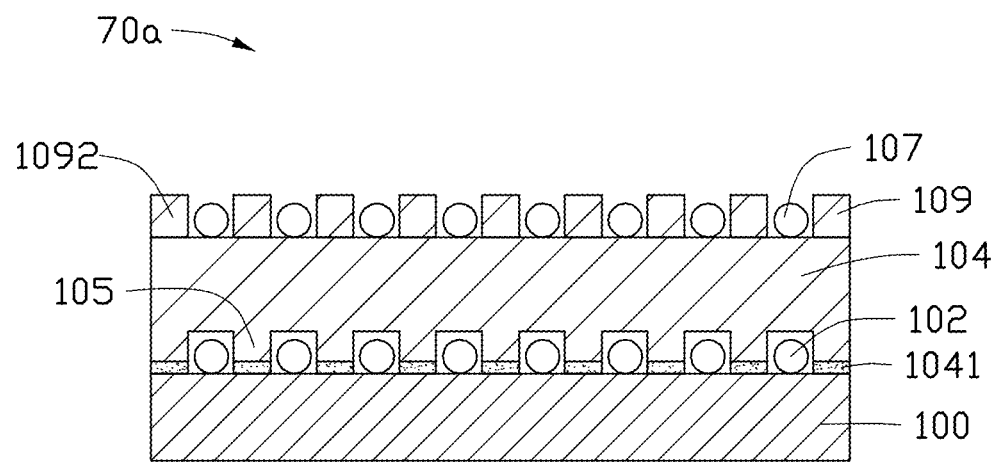
FIG. 39 is a schematic view of one embodiment of an epitaxial structure fabricated in the method of FIG. 38.

Referring to FIG. 39, an epitaxial structure 70a provided in one embodiment includes a substrate 100, a first carbon nanotube layer 102, a first epitaxial layer 104, a second carbon nanotube layer 107, and a second epitaxial layer 109. The epitaxial structure 70a is similar to the epitaxial structure 10c described above except that the second epitaxial layer 109 includes a plurality of epitaxial crystal grains 1092 spaced from each other and defines a patterned space, and the second carbon nanotube layer 107 is located in the patterned space. The patterned space has the same pattern as the patterned second carbon nanotube layer 107. Furthermore, a buffer layer 1041 can be located between the substrate 100 and the first epitaxial layer 104. The buffer layer 1041 is located on the substrate 100 and in the first apertures 105 of the first carbon nanotube layer 102.

Figure 40:
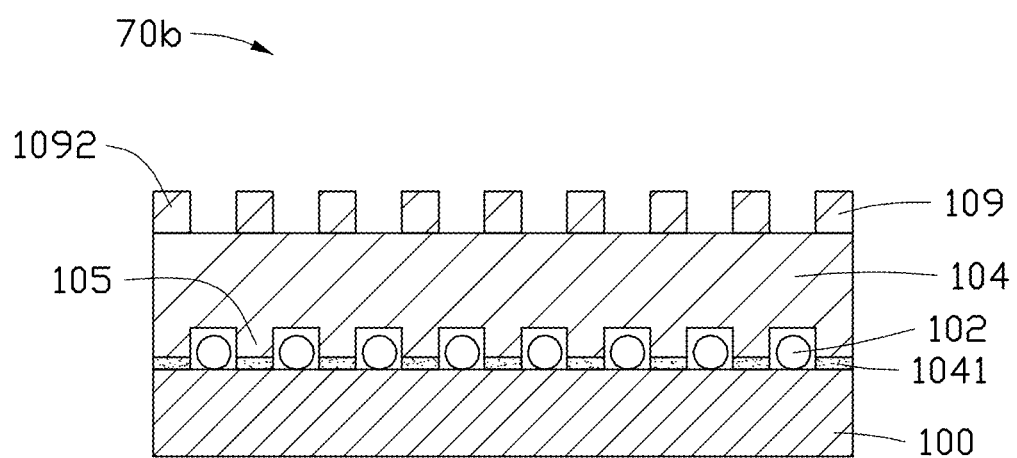
FIG. 40 is a schematic view of one embodiment of an epitaxial structure fabricated in the method of FIG. 38.

Referring to FIG. 40, an epitaxial structure 70b provided in one embodiment includes a substrate 100, a first carbon nanotube layer 102, a first epitaxial layer 104, and a second epitaxial layer 109. The epitaxial structure 70b is similar to the epitaxial structure 70a described above except that no carbon nanotube layer is located in the patterned space.

The following examples are provided to more particularly illustrate the disclosure, and should not be construed as limiting the scope of the disclosure.

Example 1

In example 1, the substrate is a SOI, the epitaxial layer is a GaN layer and grown on the SOI substrate by a MOCVD method. The nitrogen source gas is high-purity ammonia ($NH_3$), the Ga source gas is trimethyl gallium (TMGa) or triethyl gallium (TEGa), and the carrier gas is hydrogen ($H_2$). A single drawn carbon nanotube film is placed on an epitaxial growth surface of the SOI substrate. The growth of the epitaxial layer includes the following steps:

step (a), putting the SOI substrate with the drawn carbon nanotube film thereon into a vacuum reaction chamber and heating the reaction chamber to a temperature of about 1070° C.;

step (b), introducing the nitrogen source gas and the Ga source gas into the vacuum reaction chamber with the carrier gas;

step (c), vertical epitaxially growing a plurality of GaN epitaxial grains for about 450 seconds at about 1070° C.;

step (d), heating the reaction chamber to about 1110° C., reducing the flow of the Ga source gas, keeping the gas pressure of the reaction chamber and the flow of the nitrogen source gas unchanged, and making the GaN epitaxial grains epitaxially grow laterally for about 4900 seconds at about 1110° C. to obtain a GaN epitaxial film;

step (e), cooing the temperature of the reaction chamber down to about 1070° C., and increasing the flow of the Ga source gas, and making the GaN epitaxial film epitaxially grow vertically for about 10000 seconds at about 1070° C. to form a GaN epitaxial layer.

Figure 41:
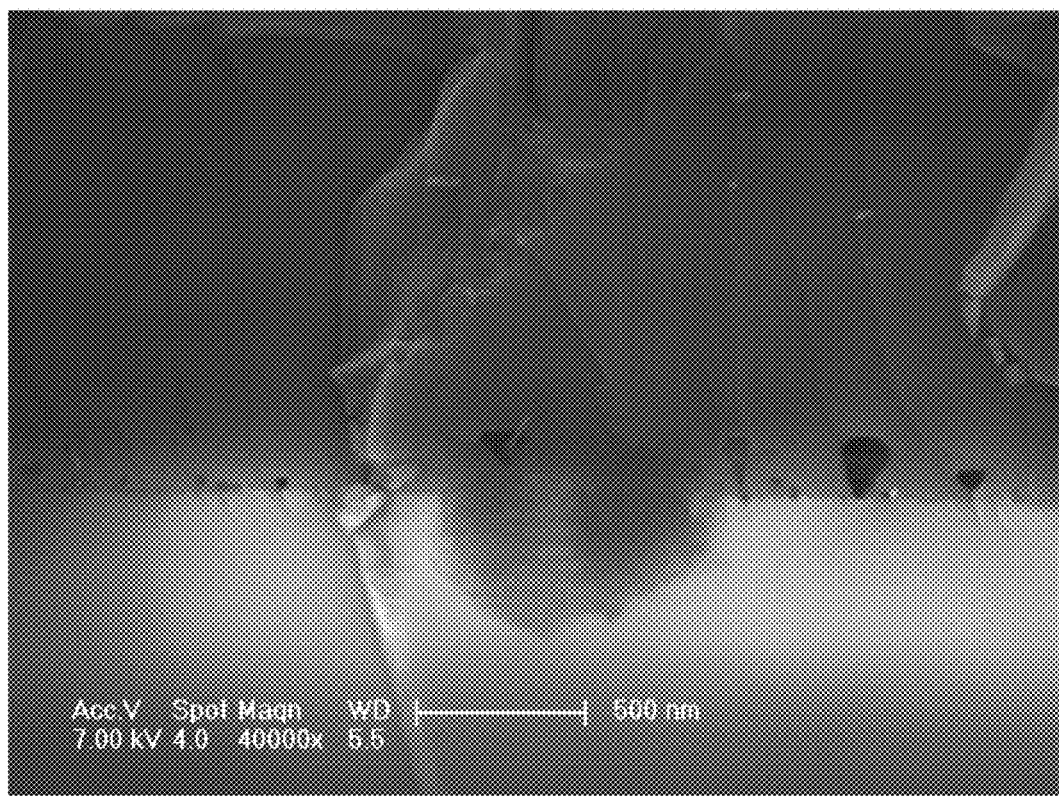
FIG. 41 is an SEM image of a cross-section of the epitaxial structure fabricated in example 1.
Figure 42:
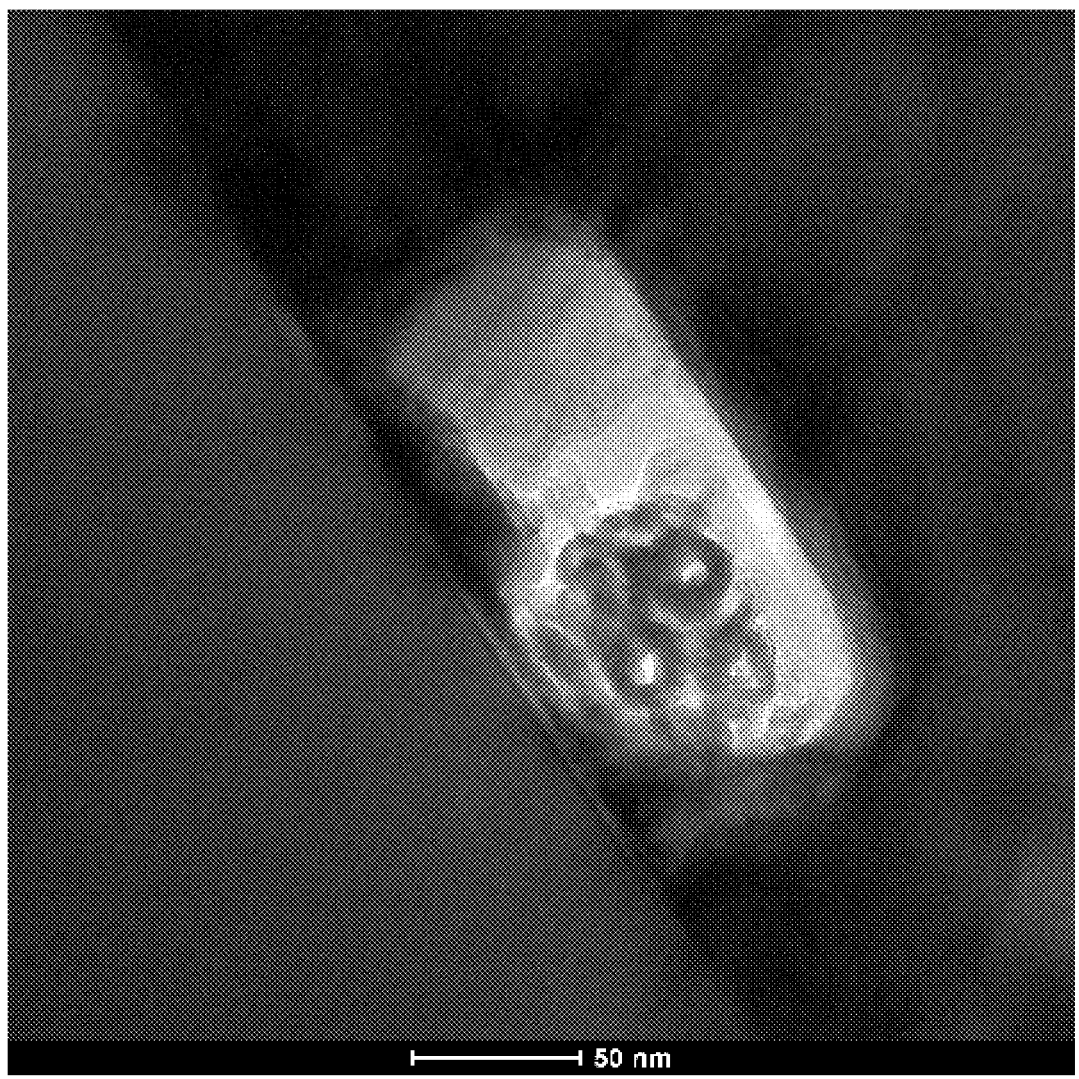
FIG. 42 is a transmission electron microscopy (TEM) image of a cross section of the epitaxial structure fabricated in example 1.

The epitaxial structure provided in example 1 is observed by SEM and TEM. Referring to FIGS. 41 and 42, the dark-colored layer is the epitaxial layer, and the light-colored layer is the substrate. A plurality of grooves is defined on the face of the epitaxial layer. The grooves are covered by the substrate to form a plurality of tunnels. The carbon nanotubes are located in the tunnels.

Example 2

In example 2, the substrate is sapphire, the epitaxial layer is grown on the sapphire substrate by MOCVD method. The nitrogen source gas is high-purity ammonia ($NH_3$), the Ga source gas is trimethyl gallium (TMGa) or triethyl gallium (TEGa), and the carrier gas is hydrogen ($H_2$). A single drawn carbon nanotube film is placed on an epitaxial growth surface of the sapphire substrate. The growth of the epitaxial layer includes the following steps:

step (a), locating the sapphire substrate with the single drawn carbon nanotube film thereon into a reaction chamber, heating the sapphire substrate to about 1100° C. to about 1200° C., introducing the carrier gas, and baking the sapphire substrate for about 200 seconds to about 1000 seconds;

step (b), growing a low-temperature GaN buffer layer with a thickness of about 10 nanometers to about 50 nanometers by cooling down the temperature of the reaction chamber to a range from about 500° C. to 650° C. in the carrier gas atmosphere, and introducing the Ga source gas and the nitrogen source gas at the same time;

step (c), stopping the flow of the Ga source gas while maintaining the flow of the carrier gas and nitrogen source gas atmosphere, increasing the temperature to a range from about 1100° C. to about 1200° C., and annealing for about 30 seconds to about 300 seconds; and step (d), maintaining the temperature of the reaction chamber in a range from about 1000° C. to about 1100° C., and reintroducing the Ga source gas to grow the high quality epitaxial layer.

Figure 43:
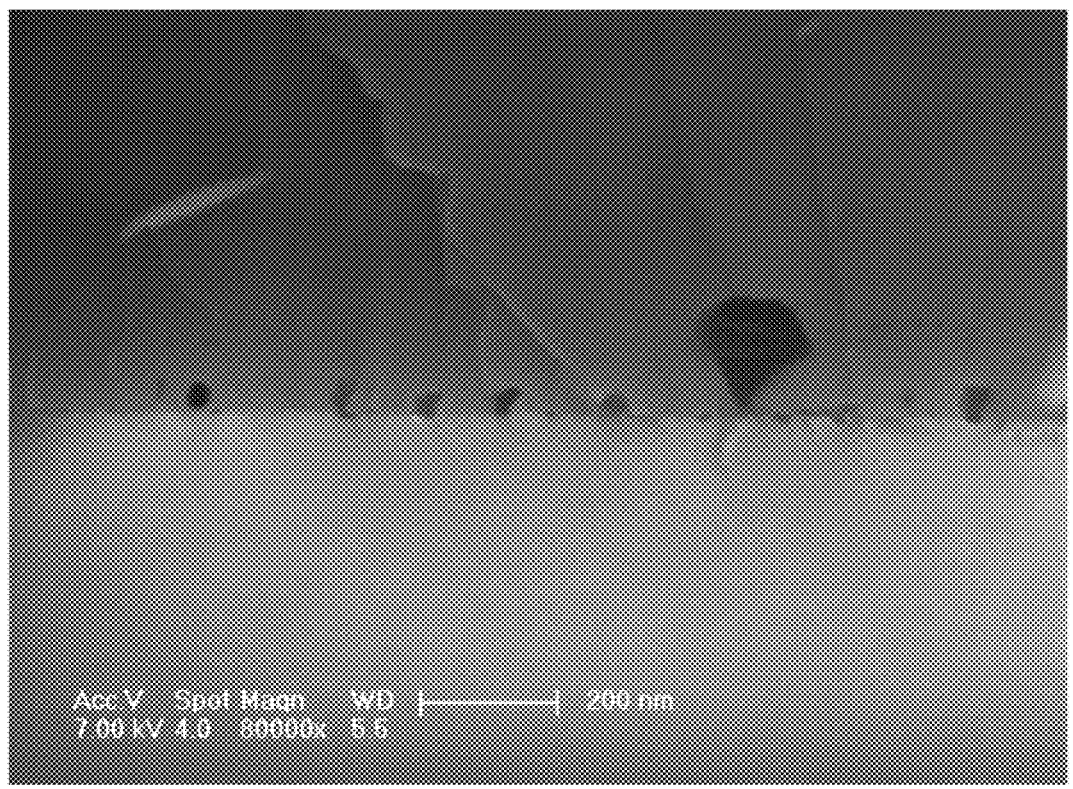
FIG. 43 is an SEM image of a cross section of the epitaxial structure fabricated in example 2.
Figure 44:
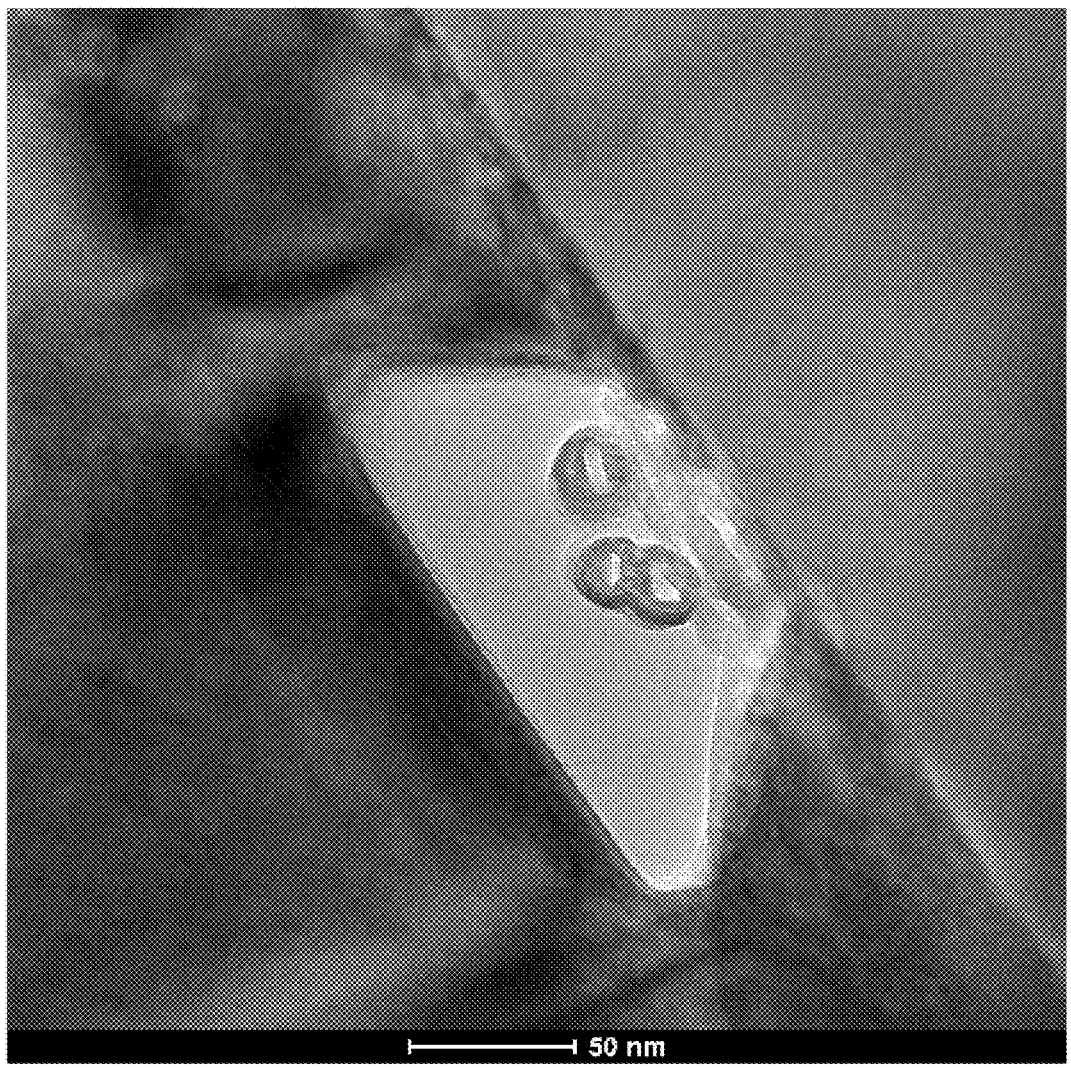
FIG. 44 is a TEM image of a cross section the epitaxial structure fabricated in example 2.

Furthermore, the epitaxial structure provided in example 2 is observed by SEM and TEM. Referring to FIGS. 43 and 44, the dark-colored layer is the GaN epitaxial layer, and the light-colored layer is the sapphire substrate. A plurality of grooves is defined on the face of the GaN epitaxial layer. The grooves are covered by the sapphire substrate to form a plurality of tunnels. The carbon nanotubes are located in the tunnels.

Example 3

Example 3 is similar to example 2 described above except that a step (e) of irradiating the epitaxial structure with a laser beam in air is performed after step (d). In step (e), the drawn carbon nanotube film is removed by oxidation. The laser beam is provided by a carbon dioxide laser device. The power of the laser device is about 30 watts. The wavelength of the laser is about 10.6 micrometers. The diameter of the laser spot is about 3 millimeters. The power density of the laser is about $0.053 \times 10^{12}$ watts per square meter. The irradiating time is less than 1.8 seconds.

Example 4

In example 4, the substrate is sapphire, the epitaxial layer is grown on the sapphire substrate by MOCVD method. The nitrogen source gas is high-purity ammonia ($NH_3$), the Ga source gas is trimethyl gallium (TMGa) or triethyl gallium (TEGa), and the carrier gas is hydrogen ($H_2$). A single drawn carbon nanotube film is placed on an epitaxial growth surface of the sapphire substrate. The method of making the epitaxial structure includes the following steps:

step (a), locating the sapphire substrate into a reaction chamber, heating the sapphire substrate to about 1100° C. to about 1200° C., introducing the carrier gas, and baking the sapphire substrate for about 200 seconds to about 1000 seconds;

step (b), growing a low-temperature GaN buffer layer with a thickness of about 10 nanometers to about 50 nanometers by cooling down the temperature of the reaction chamber to a range from about 500° C. to 650° C. in the carrier gas atmosphere, and introducing the Ga source gas and the nitrogen source gas at the same time;

step (c), stopping the flow of the Ga source gas, while maintaining the flow of the carrier gas and nitrogen source gas atmosphere, increasing the temperature to a range from about 1100° C. to about 1200° C., and annealing for about 30 seconds to about 300 seconds;

step (d), placing a single drawn carbon nanotube film on the low-temperature GaN buffer layer;

step (e), maintaining the temperature of the reaction chamber in a range from about 1000° C. to about 1100° C., and reintroducing the Ga source gas to grow the high quality epitaxial layer; and step (f), irradiating the epitaxial structure with a laser beam in vacuum.

In step (f), the laser beam has a wavelength of about 248 nanometers, an energy of about 5 electron volts, an impulse duration from about 20 ns to about 40 ns, an energy density from about 0.4 joules per square centimeter to about 0.6 joules per square centimeter. The shape of the laser spot is square with a side length of about 0.5 millimeters. The laser spot moves relative to the substrate with a speed of about 0.5 millimeters per second. After absorption of the laser beam, the low-temperature GaN buffer layer is decomposed to Ga and $N_2$. The epitaxial structure is immersed in a hydrochloric acid solution to remove the Ga and separate the substrate from the epitaxial layer, with the drawn carbon nanotube film remaining on the epitaxial layer.

Example 5

In example 5, the substrate is sapphire, the epitaxial layer is grown on the sapphire substrate by a MOCVD method. The nitrogen source gas is high-purity ammonia ($NH_3$), the Ga source gas is trimethyl gallium (TMGa) or triethyl gallium (TEGa), the carrier gas is hydrogen (H2), the In source gas is Trimethyl indium (TMIn), the Si source gas is silane ($SiH_4$), and the Mg source gas is ferrocene magnesium ($Cp_2Mg$). A single drawn carbon nanotube film is placed on an epitaxial growth surface of the sapphire substrate. The method of making the epitaxial structure includes the following steps:

step (a), locating the sapphire substrate with a single drawn carbon nanotube film thereon into a reaction chamber, heating the sapphire substrate to about 1100° C. to about 1200° C., introducing the carrier gas, and baking the sapphire substrate for about 200 seconds to about 1000 seconds;

step (b), growing the low-temperature GaN buffer layer with a thickness of about 10 nanometers to about 50 nanometers by cooling down the temperature of the reaction chamber to a range from about 500° C. to 650° C. in the carrier gas atmosphere, maintaining the chamber at a pressure from about 500 torr to about 600 torr, and introducing the Ga source gas and the nitrogen source gas at the same time;

step (c), stopping the flow of the Ga source gas, while maintaining the flow of the carrier gas and nitrogen source gas atmosphere, increasing the temperature to a range from about 1100° C. to about 1200° C., the pressure to a range from about 1100 torr to about 1200 torr, and annealing for about 30 seconds to about 300 seconds;

step (d), growing a Si doped N-type GaN epitaxial layer with a thickness of about 1 micrometer to about 3 micrometers by maintaining the temperature of the reaction chamber in a range from about 1000° C. to about 1100° C. at a pressure from about 100 torr to about 300 torr, introducing the Ga source gas and the Si source gas to;

step (e), growing a InGaN/GaN multiple-layer quantum well by stopping the flow of the Si source gas, maintaining the chamber in a temperature from about 700° C. to about 900° C. at a pressure from about 50 torr to about 500 torr, and introducing the In source gas, wherein the InGaN layer has a thickness of about 2 nanometers to about 5 nanometers, and the GaN layer has a thickness of about 5 nanometers to about 20 nanometers;

step (f), grow a Mg doped P-type GaN epitaxial layer with a thickness of about 100 nanometers to about 200 nanometers by stopping the flow of the In source gas, maintaining the chamber in a temperature from about 1000° C. to about 1100° C. at a pressure from about 76 torr to about 200 torr, and introducing the Mg source gas; and step (g), stopping growth, introducing $N_2$ gas, and maintaining the chamber in a temperature from about 700° C. to about 800° C. to anneal for about 10 minutes to about 20 minutes.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making an epitaxial structure, the method comprising:
   providing a substrate having an epitaxial growth surface;
   suspending a carbon nanotube layer above the epitaxial growth surface, wherein the carbon nanotube layer is free-standing and spaced from the epitaxial growth surface;
   applying a voltage between two opposite sides of the carbon nanotube layer so that the carbon nanotube layer produces heat to heat the substrate; and
   epitaxially growing an epitaxial layer on the epitaxial growth surface.

2. The method of claim 1, wherein the carbon nanotube layer comprises a plurality of carbon nanotubes extending along a direction substantially parallel to the epitaxial growth surface.

3. The method of claim 1, wherein the carbon nanotube layer comprises a plurality of carbon nanotubes extending along a crystallographic orientation of the substrate.

4. The method of claim 1, wherein the carbon nanotube layer entirely covers the epitaxial growth surface.

5. The method of claim 1, wherein the carbon nanotube layer defines a plurality of apertures, the epitaxial layer starts growing from the epitaxial growth surface and through the plurality of apertures to enclose the carbon nanotube layer therein so that a patterned space is formed in the epitaxial layer.

6. The method of claim 5, wherein sizes of the plurality of apertures are in a range from about 10 nanometers to about 500 micrometers.

7. The method of claim 5, wherein a duty factor of the carbon nanotube layer is in a range from about 1:4 to about 4:1.

8. The method of claim 1, wherein the carbon nanotube layer comprises a plurality of carbon nanotube wires crossed or weaved together to form a carbon nanotube net defining a patterned space, and the patterned space is a plurality of intersected tunnels interconnected with each other.

9. The method of claim 1, wherein the carbon nanotube layer is supported by two supports spaced from each other.

10. The method of claim 9, wherein the two supports are conductive; the carbon nanotube layer comprises a plurality of carbon nanotubes arranged to extend from a first support to a second support; and the applying the voltage between the two opposite sides of the carbon nanotube layer comprises applying the voltage between the first support and the second support.

11. The method of claim 1, wherein two or more than two substantially parallel carbon nanotube layers are suspended above the epitaxial growth surface and spaced from each other.

12. The method of claim 1, further comprising decreasing a thickness of the carbon nanotube layer by irradiating the carbon nanotube layer by a laser or microwave.

13. The method of claim 12, wherein the decreasing the thickness of the carbon nanotube layer is performed before the placing the carbon nanotube layer on the epitaxial growth surface.

14. The method of claim 1, wherein the carbon nanotube layer comprises a plurality of carbon nanotubes coated with at least one non-carbon nanotube material, and the at least one non-carbon nanotube material is selected from the group consisting of silicon carbide, boron nitride, silicon nitride, silicon dioxide, metal carbides, metal oxides, metal nitrides, and combinations thereof.

15. The method of claim 1, wherein the substrate is selected from the group consisting of a GaAs substrate, a GaN substrate, an AlN substrate, a Si substrate, a SiC substrate, a MgO substrate, a ZnO substrate, a $LiGaO_2$ substrate, a $LiAlO_2$ substrate, a sapphire substrate, and a silicon layer on an insulator, and the epitaxial layer is selected from the group consisting of a GaN epitaxial layer, a Si epitaxial layer, a GaAs epitaxial layer, a GaSb epitaxial layer, an InN epitaxial layer, an InP epitaxial layer, an InAs epitaxial layer, an InSb epitaxial layer, an AlP epitaxial layer, an AlAs epitaxial layer, an AlSb epitaxial layer, an AlN epitaxial layer, a GaP epitaxial layer, a SiC epitaxial layer, a SiGe epitaxial layer, a GaMnAs epitaxial layer, a GaAlAs epitaxial layer, a GaInAs epitaxial layer, a GaAlN epitaxial layer, a GaInN epitaxial layer, an AlInN epitaxial layer, a GaAsP epitaxial layer, an InGaN epitaxial layer, an AlGaInN epitaxial layer, an AlGaInP epitaxial layer, a GaP:Zn epitaxial layer, and a GaP:N epitaxial layer.

* * * * *